(12) United States Patent
Motoyoshi

(10) Patent No.: US 7,362,607 B2
(45) Date of Patent: Apr. 22, 2008

(54) SOLID-STATE MEMORY DEVICE AND METHOD FOR ARRANGEMENT OF SOLID-STATE MEMORY CELLS

(75) Inventor: Makoto Motoyoshi, Kanagawa (JP)

(73) Assignee: Sony Corporation (JP)

( * ) Notice: Subject to any disclaimer, the term of this patent is extended or adjusted under 35 U.S.C. 154(b) by 207 days.

(21) Appl. No.: 11/108,699

(22) Filed: Apr. 19, 2005

(65) Prior Publication Data
US 2005/0237791 A1 Oct. 27, 2005

(30) Foreign Application Priority Data
Apr. 22, 2004 (JP) ............................. 2004-127159

(51) Int. Cl.
*G11C 11/00* (2006.01)
(52) U.S. Cl. ..................... 365/158; 365/171; 365/173
(58) Field of Classification Search ................ 365/158, 365/171, 173
See application file for complete search history.

(56) References Cited

U.S. PATENT DOCUMENTS

| 6,026,010 | A * | 2/2000 | Ema et al. ................... 365/149 |
| 6,081,445 | A | 6/2000 | Shi et al. |
| 6,174,737 | B1 | 1/2001 | Durlam et al. |
| 6,741,495 | B2 * | 5/2004 | Kunikiyo et al. ............ 365/158 |
| 6,956,270 | B2 * | 10/2005 | Fukuzumi ................... 257/421 |
| 7,054,186 | B2 * | 5/2006 | Iwata .......................... 365/158 |
| 2002/0134997 | A1 | 9/2002 | Ito et al. |
| 2003/0185065 | A1 | 10/2003 | Ishikawa |
| 2004/0017706 | A1 | 1/2004 | Freitag et al. |

FOREIGN PATENT DOCUMENTS

EP 0 936 623 A2 8/1999

OTHER PUBLICATIONS

French Office Action to co-pending application mailed on Jul. 14, 2006.
Daughton, J.M.—Magnetoresistive Memory Technology—Thin Solid Films, 216 pages 162-168 (1992) Publisher—Elsevier Sequoia.

(Continued)

*Primary Examiner*—Anh Phung
*Assistant Examiner*—Hien N Nguyen
(74) *Attorney, Agent, or Firm*—Rader Fishman & Grauer PLLC; Ronald P. Kananen

(57) ABSTRACT

A high-capacity magnetic memory device in which the magnetic field for writing is nearly uniform for all memory elements. It is realized by reducing the deformation of resist pattern which occurs in photolithography when mask patterns are close to each other. The magnetic memory device is an MRAM composed of a large number of memory cells, each including one TMR element, one transistor for reading (selection), and reading plugs that connect the TMR element to the transistor for reading (selection). These memory cells are arranged such that the TMR elements are in a pattern of translational symmetry. For writing, memory cells are connected by the bit lines and the writing word lines which intersect orthogonally. The long axis of the TMR element is oriented aslant 45° with respect to these lines, so that the TMR elements are capable of toggle-mode writing.

10 Claims, 19 Drawing Sheets

OTHER PUBLICATIONS

Miyazaki, T., Tezuka, N.—Giant Magnetic Tunneling Effect in FE/A1$_2$0$_3$/FE Junction, Journal of Magnetism and Magnetic Materials 139 pages (1995) pp. L231-L234—Elsevier.

Parkin, S.S.P., More, N., and Roche, K.P.—Oscillations in Exchange Coupling and Magnetoresistance in Metallic Superlattice Structures—Physical Review Letters, vol. 64, No. 19—pp. 2304-2308 (May 7, 1990) The American Physical Society.

Meservey, R. and Tedrow, P.M.—Spin-polarized Electron Tunneling—Physics Reports 238 No. 4 (1994) pp. 173-243—Elsevier Science B.V.

Scheuerlein, Roy, Gallagher, William, Parkin, Stuart, Lee, Alex, Ray, Sam, Robwerazzi, Ray, Reohr, William—A 10ns Read and Write Non-Volatile Memory Array Using a Magnetic Tunnel Junction and FET Switch in each Cell—IEEE International Solid-State Circuits Conference (2000) pages.

Tag, D.D., Wang, P.K., Speriosu, V.S., Le, S., Fontana, R.E., Rishton, S.—An IC Process Compatible Nonvolatile Magnetic RAM—IEDM 95-997 pp. 5.7.1-5.7.4.

\* cited by examiner

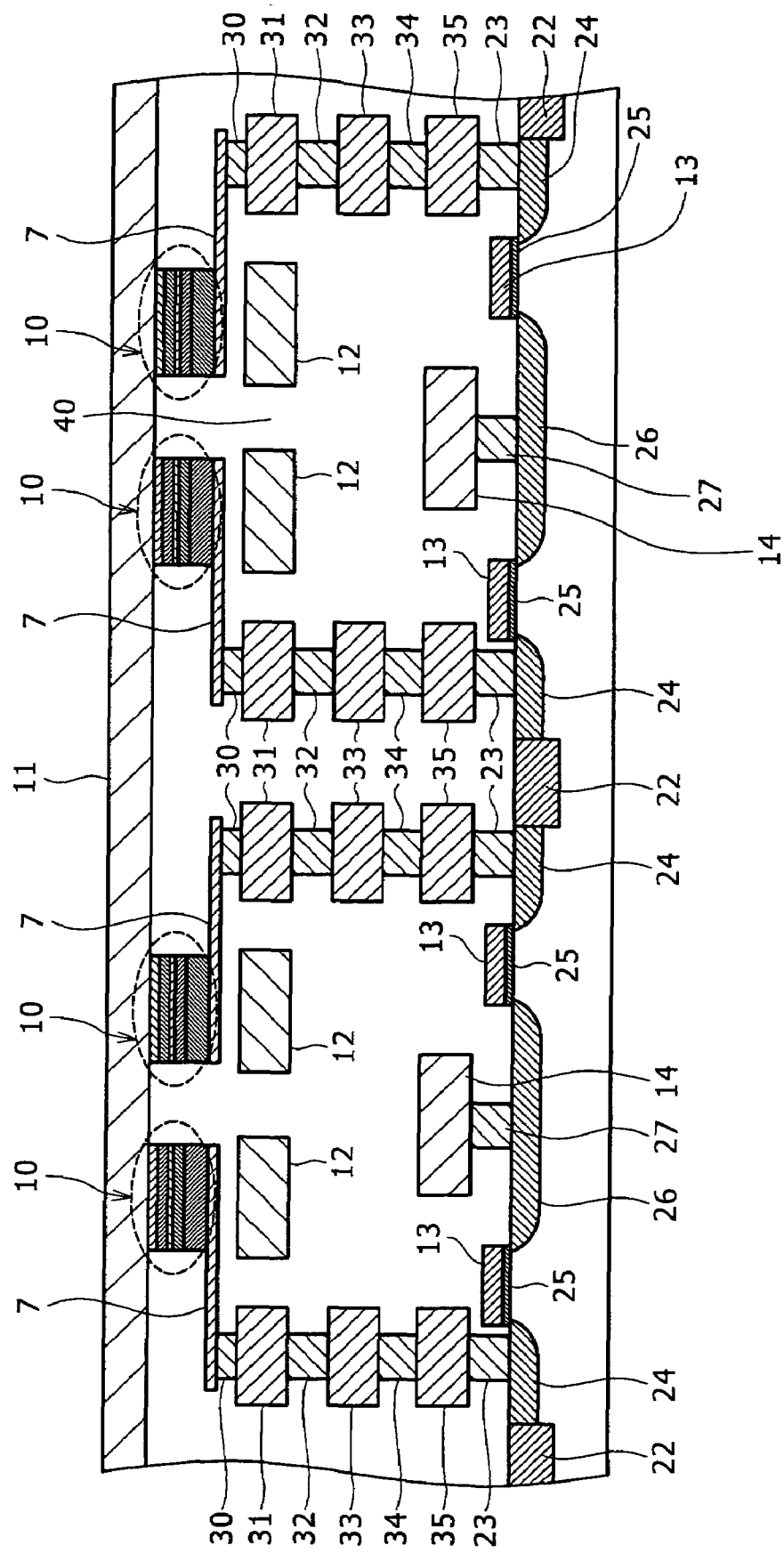

SOLID-STATE MEMORY DEVICE AND METHOD FOR ARRANGEMENT OF SOLID-STATE MEMORY CELLS

BACKGROUND OF THE INVENTION

The present invention relates to a solid-state memory device to be produced by lithography and a method for arrangements of solid-state memory cells. The solid-state memory device includes MRAM (Magnetic Random Access Memory), DRAM (Dynamic Random Access Memory), SRAM (Static Random Access Memory), FRAM (Ferroelectric Random Access Memory), ROM (Read Only Memory), PROM (Programmable ROM), and EPROM (Erasable and Programmable ROM). More particularly, the present invention relates to the array pattern of the information storing parts of memory elements.

The recent wide spread of information and communications equipment, particularly personal small ones such as portable terminals, requires their constituents such as memory and logic elements to have improved performance, including high integration, high speed, and low power consumption.

Especially, non-volatile memory is regarded as indispensable in the age of ubiquitous computing because it preserves important personal information in case of dead battery and network failure or server breakdown. Recent portable equipment is so designed as to reduce power consumption as much as possible by keeping idle circuit blocks in stand-by mode. It would be possible to save power and memory if high-speed, high-capacity non-volatile memory is realized. It would make the "instant-on function" feasible which permits equipment to start working instantly as soon as power is turned on.

Among non-volatile memory devices are flush memory using semiconductors, and FRAM (ferroelectric random access memory) using ferroelectric substances.

Unfortunately, flush memory is limited in writing speed to the order of microseconds. FRAM is also limited in the number of rewriting cycles to $10^{12}$ to $10^{14}$, that is, it is too poor in endurance to replace SRAM (Static Random Access Memory) and DRAM (Dynamic Random Access Memory). Moreover, it presents difficulties in microprocessing of ferroelectric capacitors therein.

There is a noteworthy non-volatile memory device free of these disadvantages, capable of high-speed operation with a low power consumption, and suitable for high capacity (or high degree of integration). It is a magnetic memory device called MRAM (Magnetic Random Access Memory).

MRAM in the early stage is based on the spin valve which utilizes the AMR (Anisotropic Magnetoresistive) effect or the GMR (Giant Magnetoresistance) effect. The former was reported by J. M. Daughton in "Thin Solid Films", vol 216, pp. 162-168, 1992, and the latter was reported by D. D. Tang et al. in "IEDM Technical Digest" pp. 995-997, 1997. Unfortunately, they have the disadvantage that the memory cell has a low resistance of 10 to 100. which leads to a large power consumption per bit for reading. This disadvantage makes it difficult to realize a large-capacity memory.

There is another type of MRAM which utilizes the TMR (Tunnel Magnetoresistance) effect. It has come to attract attention because of its remarkable increase in the rate of change in resistance from 1 to 2% at room temperature (as reported by R. Meservey et al. in "Physics Reports", vol. 238, pp. 214-217, 1994) to nearly 20% (as reported by T. Miyazaki et al. in "J. Magnetism & amp; Magnetic Material", vol. 139, (L231), 1995).

A TMR element is composed of a magnetization free layer (memory layer) and a magnetization pinned layer, with a tunnel barrier layer interposed between these two magnetic layers. It stores information as "0" or "1" depending on whether the two magnetic layers are magnetized in the "parallel" direction or "anti-parallel" direction. The difference in the direction of magnetization changes the intensity of current flowing through the tunnel barrier, and this change permits the reading of information.

An MRAM of TMR type has TMR elements arrayed in a matrix pattern. It also has bit lines for access in the row and column directions and word lines for writing so that it records information in TMR devices. Information is written selectively in TMR devices only at the intersection of two lines. This process is based on the asteroid characteristics mentioned later.

Thus, the MRAM of TMR type is a semiconductor magnetic memory which can read information based on the magnetoresistance effect resulting from spin-dependent conduction characteristic of a nanomagnetic substance. It is a non-volatile memory that retains memory without external power supply. Because of its simple structure, it can be highly integrated with ease. It is capable of rewriting many times because it relies on the rotation of magnetic moment for recording. It is also expected to have a very high access speed. In fact, its ability to run at 100 MHz has been reported by R. Scheuerlein et al. in ISSCC Digest of Technical Papers, pp. 128-129, February 2000.

A detailed description will be given below of the MRAM of TMR type.

FIG. 6 is a perspective view showing a TMR element 10 as a memory cell of MRAM device. The TMR element 10, which is formed on a substrate 8, includes a magnetization free layer (memory layer) 2 and a magnetization pinned layer 4, with the former allowing the direction of magnetization to reverse comparatively easily and the latter keeping the direction of magnetization fixed. These two layers are formed from a ferromagnetic material such as nickel, iron, cobalt, or alloy thereof. The latter layer 4 may be a multi-layered film composed of ferromagnetic material, metal, and ferromagnetic material having the SAF (Synthetic Antiferromagnet) coupling. SAF has been reported by S. S. Parkin et al. in Physical Review Letters, 7, May, pp. 2304-2307 (1990).

The magnetization pinned layer 4 is in contact with the antiferromagnetic layer 5. These two layers produce an exchange interaction, which imparts strong magnetic anisotropy to the magnetization pinned layer 4. The antiferromagnetic layer 5 is formed from a manganese alloy of iron, nickel, platinum, iridium, or rhodium, or an oxide of cobalt or nickel.

The magnetization free layer (memory layer) 2 has the axis of easy magnetization (or the axis along which the ferromagnetic material is easily magnetized) which is parallel to the direction of magnetization of the magnetization pinned layer 4. Therefore, it is magnetized easily in the direction parallel or antiparallel to the direction of magnetization of the magnetization pinned layer 4, so that the direction of magnetization is easily reversed between these two states. Consequently, the magnetization free layer (memory layer) 2 can be used as an information storage medium if its two states of magnetization ("parallel" and "antiparallel" to the direction of magnetization of the magnetization pinned layer 4) are made to correspond to "0" and "1" representing information.

Between the magnetization free layer (memory layer) 2 and the magnetization pinned layer 4 is interposed a tunnel barrier layer 3 formed from an insulating material such as an oxide or nitride of aluminum, magnesium, or silicon. It cuts off the magnetic coupling between the two layers 2 and 4, and it also permits tunnel current to flow in response to the direction of magnetization of the layer 2. The magnetic layer 5 and the conducting layer constituting the TMR element 10 are formed mainly by sputtering. The tunnel barrier layer 3 may be formed by oxidizing or nitriding the metal film which has been formed by sputtering.

The top coat layer 1 prevents mutual diffusion between the TMR element 10 and the wiring connected thereto. It also reduces contact resistance and protects the magnetization free layer (memory layer) 2 from oxidation. It is usually formed from copper, tantalum, titanium, or titanium nitride. The leading electrode layer 6 serves as a connection between the TMR element and a switching element connected thereto in series. This leading electrode layer 6 may function also as the antiferromagnetic layer 5.

FIG. 7 is a partly simplified, enlarged perspective view showing the memory of ordinary MRAM, with reading circuits omitted for brevity. This MRAM has nine memory cells and mutually intersecting bit lines 11 and writing word lines 12. Each TMR element 10 is placed at the point of intersection.

FIGS. 8 and 9 are equivalent circuit diagrams of MRAM. FIG. 8 shows the entire structure and FIG. 9 is a partly enlarged view. FIG. 9 shows six memory cells for illustration. At each point of intersection of the bit line 11 and the writing word line 12 are arranged a TMR element 10 and a field effect transistor 15 connected thereto in series. The field effect transistor 15 selects a desired element from which information is read. In addition, there are word lines 13 for reading which control ON and OFF of the field effect transistor 15 and sense lines 14 for output of read information. In the peripheral circuits, the bit lines 11 are connected to the bit line current driving circuit 16, and the word lines 12 are connected to the bidirectionally writing word line current driving circuit 17. The sense lines 14 are connected to the sense amplifier 18 which detects read information.

FIG. 10 is a schematic sectional view showing one memory cell arranged in the memory part of MRAM of related art. For brevity, the interlayer insulating film 40 is shown with its boundary and hatching omitted. (The same shall apply hereinafter.)

Above the memory cell are arranged the TMR element 10, the bit line 11, and the writing word line 12, which have been mentioned above. The bit line 11, which is formed on the TMR element 10, is electrically connected to the top coat layer 1. The writing word line 12 is formed under the TMR element 10, with an insulating layer interposed between them.

Under the memory cell is the p-type silicon semiconductor substrate 20 which has the p-type well region 21. In the well region 21 is formed the n-type MOS field effect transistor 15 including the drain electrode 23, the drain region 24, the gate electrode 13, the gate insulating film 25, the source region 26, and the source electrode 27. The gate electrode 13 of the transistor 15 is a long strip connecting cells, so that it serves also as the reading word line 13. The drain electrode 23 is connected to the leading electrode layer 6 of the TMR element 10 through the leading wiring 7, the reading connecting plugs 30 and 32, and the reading landing pads 31 and 33. The source electrode 27 is connected to the sense line 14. (In the following figures, the connecting plug is abbreviated as plug and the landing pad is abbreviated as land.) According to the example shown here, the leading wiring 7 is connected to the reading landing pad 31 through the reading connecting plug 30. However, this may be modified such that the reading connecting plug 30 is omitted and the leading wiring layer is formed directly in the connecting hole. (This shall apply hereinafter.)

The memory cell constructed as mentioned above writes information in the TMR element 10 when current is applied to the bit line 11 and the writing word line 12 in such a way that the two currents generate a combined magnetic field which magnetizes the magnetization free layer (memory layer) 2. The direction of magnetization is assigned "parallel" or "antiparallel" in response to the direction of magnetization of the magnetization pinned layer 4.

The magnetic field in the magnetization free layer (memory layer) 2 of the TMR element 10 is a vector sum of two magnetic fields $H_{EA}$ and $H_{HA}$. The magnetic field $H_{EA}$ in the direction of easy axis of magnetization is induced by writing current flowing through the bit line 11. The magnetic field $H_{HA}$ in the direction of hard axis of magnetization is induced by writing current flowing through the writing word line 12.

Writing in MRAM is usually accomplished by applying two magnetic fields $H_{EA}$ ($<H_s$) and $H_{HA}$ ($<H_s$), either of which is not strong enough to bring about magnetization reversal, to the memory cell at the intersection of the bit line 11 and the writing word line 12 which are supplying current, so that the magnetic spin is reversed only in the memory cell on which both of the magnetic fields $H_{EA}$ and $H_{HA}$ act. This is based on the magnetization reversal indicated by the asteroid curve. Incidentally, $H_s$ denotes the one-way reversing magnetic field. The principle of the foregoing will be detailed in the following. (Refer to U.S. Pat. No. 6,081,445.)

FIG. 11 shows an asteroid curve representing how the magnetization free layer (memory layer) 2 of the TMR element responds to magnetic fields when information is written. The asteroid curve is given by the equation below based on the condition for minimum energy.

$$H_{EA}^{2/3}+H_{HA}^{2/3}=H_s^{2/3}$$

It expresses the condition for writing in the TMR element. In other words, it expresses the threshold value of the applied magnetic field which reverses the direction of magnetization of the magnetization free layer (memory layer) 2. Here, the magnitude of $H_s$ (one-way reversing magnetic field) depends on material as well as shape of the magnetization free layer (memory layer) 2.

As shown in FIG. 11, the magnetization free layer (memory layer) 2 is acted on by the combined magnetic field H which is a vector sum of $H_x$ and $H_y$, where $H_x$ ($<H_s$) denotes the magnetic field $H_{EA}$ applied in the direction of the easy axis of magnetization and $H_y$ ($<H_s$) denotes the magnetic field $H_{HA}$ applied in the direction of the hard axis of magnetization. Only when the combined magnetic field H is greater than the threshold value $H_c$ corresponding to the point C on the asteroid curve and has the magnitude reaching the region 151A or 152 outside the asteroid curve, it is able to reverse the direction of magnetization of the magnetization free layer (memory layer) 2. On the other hand, when the combined magnetic field H as a vector sum remains within the region 150 of the asteroid curve, it is unable to reverse the direction of magnetization of the magnetization free layer (memory layer) 2.

The above-mentioned principle of reversing the direction of magnetization suggests that in the presence of both $H_{EA}$ and $H_{HA}$, the magnetic field required to reverse the direction of magnetization is smaller than that which exists individually. It also suggests that if both of the bit line 11 and the writing word line 12 are used simultaneously, it is possible to write information selectively only in the TMR element 10 (memory cell) at the intersection of the two lines.

In other words, the writing current flowing through the bit line 11 applies $H_x$ (or $H_{EA}$ which is the magnetic field in the direction of easy axis of magnetization) to all the TMR elements 10 arranged under the bit line 11, and the writing current flowing through the writing word line 12 applies $H_y$ (or $H_{HA}$ which is the magnetic field in the direction of hard axis of magnetization) to all the TMR elements 10 arranged above the writing word line 12. However, the magnetic field which is applied individually in the direction of easy axis of magnetization or in the direction of hard axis of magnetization is smaller than the threshold value of the magnetic field for magnetization reversal. The threshold value in this case is $H_s$ (or one-way reversing magnetic field) which is on the x axis (or easy axis of magnetization) or the y axis (or hard axis of magnetization) on the asteroid curve mentioned above. Consequently, $H_x$ or $H_y$, which is smaller than $H_s$, cannot reverse the direction of magnetization of the magnetization free layer (memory layer) 2 so long as it is applied individually. However, at the intersection of the bit line 11 and the writing word line 12, the writing current generates the combined magnetic field H which exceeds the threshold value $H_c$ on the asteroid curve (or which reaches the region 151(A) outside the asteroid curve). Thus the memory cell at the intersection is acted on by both $H_x$ and $H_y$, and the magnetization free layer (memory layer) 2 in the memory cell has its direction of magnetization reversed.

Incidentally, if either $H_x$ or $H_y$ is greater than $H_s$ (or one-way reversing magnetic field), then information is written in all the memory cells on which it acts on. Therefore, both $H_x$ or $H_y$ should be smaller than $H_s$ and should not reach the region 152. The gray region 151(A) shown in FIG. 11 is the adequate region for the combined magnetic field to be applied to the magnetization free layer (memory layer) 2 for information writing.

The foregoing is applicable to a single memory cell. However, a practical magnetic memory device contains a very large number of TMR elements 10, say about one million in a 1M bit MRAM. These TMR elements slightly vary in characteristic properties from one element to another. Therefore, it is to be noted that individual elements somewhat differ in the threshold value shown in the asteroid curve and the adequate region A for the combined magnetic field to be applied for writing.

FIG. 12 is a graph showing two regions for the adequate combined magnetic fields to be applied for writing to the magnetization free layer (memory layer) 2 of two TMR elements 10 differing in the magnitude of $H_s$ (or one-way reversing magnetic field). The symbol $A_1$ represents the region for the adequate combined magnetic field to write information in the TMR element 10 whose one-way reversing magnetic field is $H_{s1}$. Likewise, the symbol $A_2$ represents the region for the adequate combined magnetic field to write information in the TMR element 10 whose one-way reversing magnetic field is $H_{s2}$. Now, the combined magnetic field to be applied to write information adequately in these two TMR elements should be in the region where $A_1$ and $A_2$ overlap each other. If a group of memory cells include a TMR element 10 which greatly differs in $H_s$ (or one-way reversing magnetic field), then the combined magnetic field which can correctly drive all of TMR elements 10 would be limited to a very narrow range.

FIG. 13 is a schematic sectional view illustrating how information is read from the TMR element 10. The illustrated layer structure is simplified by omitting the top coat layer 1, the antiferromagnetic layer 5, and the leading electrode layer 6.

Reading of information recorded in the TMR element 10 is accomplished by using the TMR effect which is one of the magnetoresistance effects. The TMR effect is defined as the phenomenon that resistance to tunnel current flowing from one to the other of magnetic layers facing each other through a tunnel barrier layer is small if the direction of magnetic spin of the two magnetic layers is "parallel" and it is large if the direction is "antiparallel".

The foregoing is explained below more specifically with reference to FIG. 13. A tunnel current supplied from the bit line 11 flows through the magnetization free layer (memory layer) 2, the tunnel barrier layer 3, and the magnetization pinned layer 4. Reading current, which varies depending on the resistance to the tunnel current, is led out of the leading electrode layer 6. Thus, the magnitude of the reading current indicates the direction of magnetic spin of the magnetization free layer (memory layer) 2.

In other words, if the directions of magnetization of the magnetization free layer (memory layer) 2 and the magnetization pinned layer 4 are "parallel" to each other and hence the magnetic spins are aligned as shown in the left side of FIG. 13, then resistance between the two layers is small and a large reading current flows through the tunnel barrier layer 3. By contrast, if the directions of magnetization of the magnetization free layer (memory layer) 2 and the magnetization pinned layer 4 are "antiparallel" to each other and hence the magnetic spins are opposite as shown in the right side of FIG. 13, then resistance between the two layers is large and a small reading current flows through the tunnel barrier layer 3.

As shown in FIG. 10, the leading electrode layer 6 of the TMR element 10 is connected to the drain electrode 23 of the transistor 15 for reading through the leading wiring 7, the reading connecting plugs 30 and 32, and the reading landing pads 31 and 32. The source electrode 27 of the reading transistor 15 is connected to the sense line 14. Therefore, at the time of MRAM reading, one TMR element 10 is selected by control signals to the gate electrode (reading word line) 13 from the TMR elements 10 which are connected to the bit line 11 to which the drive current is applied. The reading current of the selected TMR element 10 is output to the sense line 14 through the field effect transistor 15 for reading. In this way the field effect transistor 15 functions as a switching element to selectively read information stored in the TMR element 10.

Incidentally, the transistor 15 may be an n-type or p-type field effect transistor; however, it may be replaced by any switching element such as diode, bipolar transistor, and MESFET (Metal Semiconductor Field Effect Transistor).

FIG. 14 a plan view showing the arrangement of a 1M bit MRAM. It is to be noted that a large number of memory cells are concentratedly formed in the memory part, and peripheral circuits such as control circuits are formed around the memory part.

FIG. 15 is a plan view showing an example of the memory cell arrangement in MRAM of related art (refer to Patent Document 1: U.S. Pat. No. 6,174,737, specification pp. 2-6, FIGS. 1 to 13). In the case of MRAM shown, two bilaterally symmetrical memory cells are paired, and one pair is a unit of the large number of memory cells. One memory cell includes one TMR element 10 and one transistor for reading (selection). It is a memory cell of 1T1J type. It also includes the lead wiring 7 extending from the leading electrode 6 of the TMR element 10 and the reading connecting plug 30 which connects the lead wiring 7 to the drain electrode of the transistor for reading (selection). There are also the bit lines 11 and the writing word lines 12 connected to memory cells. For brevity, lower wirings and transistors for reading (selection) are not shown.

FIG. 16 is a schematic sectional view showing the arrangement of four memory cells of the MRAM mentioned above. One memory cell is essentially identical in structure with that shown in FIG. 10. That is, in the upper part of the memory cell are arranged the TMR element 10 (mentioned above), the bit line 11, and the writing word line 12. The bit line 11 is formed above the TMR element 10 so that it is electrically connected to the top coat layer 1 of the TMR element 10, and the writing word line 12 is formed under the TMR element 10, with an insulating layer interposed between them. In the lower part of the memory cell is the p-type well region 21 formed in the p-type silicon semiconductor substrate 20. In the p-type well region 21 is the n-type MOS field effect transistor 15 for section which includes the drain electrode 23, the drain region 24, the gate electrode 13, the gate insulating film 25, the source region 26, and the source electrode 27. The gate electrode 13 of the transistor 15 is a long narrow strip which connects cells, and it functions also as the read word line 13. The drain electrode 23 is connected to the leading electrode layer 6 of the TMR element 10 through the lead wiring 7, the reading connecting plugs 30, 32, and 34, and the reading landing pads 31, 33, and 35. The source electrode 27 is connected to the sense line 14. The source region 26, the source electrode 27, and the sense line 14 are shared by the bilaterally symmetrical two memory cells.

The memory part of the MRAM shown in FIGS. 15 and 16 is produced by the process outlined in the following.

The process starts with forming the MOS field effect transistors 15 for reading and the oxide films 22, such as STI (Shallow Trench Isolation) and LOCOS (Local Oxidation of Silicon), to separate the transistors 15, in the p-type well region 21 of the silicon substrate 20 by using the known semiconductor technology.

In the next step, the insulating film and lower wiring are formed. The writing word line 12 and the reading landing pad 31 are formed in the following manner. A silicon oxide film as the interlayer insulating film is deposited by CVD (Chemical Vapor Deposition) method. The interlayer insulating film is patterned by photolithography and dry etching. A thin film (not shown) of tantalum or tantalum nitride as the barrier layer is formed by sputtering over the entire surface of the interlayer insulating film. Wiring grooves and openings are filled with copper by CVD method or plating method. The surface is planarized by CMP (chemical-mechanical polishing). In this way, the writing word line 12 and the reading landing pad 31 are formed. The sense line 14 is formed in the following manner. An aluminum thin film is formed by sputtering or vapor deposition. Then, it is patterned by photolithography and dry etching. In this way, the aluminum wiring is formed.

FIGS. 17 and 18 are schematic sectional views showing the flow of steps for fabricating the upper structures, such as TMR element 10, on the lower wiring layer which has been formed as mentioned above. The position of constituents in these sectional views is identical with that shown in FIG. 16; therefore, for brevity, these sectional views only show the upper part above the interlayer insulating film on which the writing word line 12 and the reading landing pad 31 are formed.

A silicon nitride film (not shown) to prevent diffusion of copper ions is formed by CVD method. As shown in FIG. 17A, the interlayer insulating film 50 which is a silicon oxide film is deposited by CVD method and then it is patterned by photolithography and dry etching to form the openings 51.

As shown in FIG. 17B, a thin film of titanium nitride as the barrier layer (not shown) is formed by sputtering over the entire surface of the interlayer insulating film 50. The openings 51 are filled with tungsten or the like by CVD method. The surface is planarized by CMP method. In this way the connecting plugs 30 (or tungsten plugs) for reading are formed.

As shown in FIG. 17C, the following layers are sequentially formed by sputtering over the entire surface. A tantalum layer which becomes the leading electrode layer 6 and the lead wiring 7. A layer of manganese alloy of platinum which becomes the antiferromagnetic layer 5. A layer of iron-cobalt alloy which becomes the magnetization pinned layer 4. An aluminum oxide layer which becomes the tunnel barrier layer 3. A layer of CoFe-30B (iron-cobalt-boron alloy) which becomes the magnetization free layer 2. A layer of thallium which becomes the top coat layer 1. In this way the layers constituting the TMR element 10 are formed. Incidentally, the tunnel barrier layer 3 is formed by oxidizing or nitriding the metal film formed by sputtering.

As shown in FIG. 17D, a positive-type resist layer 52 is formed on the surface by coating. The resist layer 52 is exposed through the photomask 55 which has an exposure pattern corresponding to the shape of the TMR element. Exposure is followed by development. In this way there is obtained the resist mask 56 which has been patterned in the shape of the TMR element. As mentioned later, the exposure pattern 53 may be deformed due to proximity effect if the patterns of TMR element are close to each other. As the result, it is impossible to form the resist mask 56 which is correctly patterned in the shape of the TMR element.

As shown in FIG. 18A, dry etching is performed through the resist mask 56 to form the top coat layer 1 conforming to the shape of the TMR element.

Next, the resist mask 56 is removed. As shown in FIG. 18B, etching is performed through the top coat layer 1 on the memory layer 2, the tunnel barrier layer 3, the magnetization pinned layer 4, and the antiferromagnetic layer 5, so that they conform to the shape of the TMR element 10.

As shown in FIG. 18C, the resist mask 57 is formed by photolithography. Etching is performed on the leading electrode layer 6 to form the leading electrode layer 6 and the lead wiring 7 of the TMR element 10. The resist mask 57 is removed.

Although not shown, a silicon oxide film, as the interlayer insulating film 54, is deposited by CVD method, so that the TMR element 10 and the lead wiring 7 are embedded. Subsequently, the bit lines 11 of copper or aluminum are formed by the above-mentioned method. Finally, the protective layer is formed on the top surface.

In the foregoing example, the lead wiring 7 is connected to the reading landing pad 31 through the reading connecting plug 30. However, this structure may be modified such that the step of forming the reading connecting plug 30 shown in FIG. 17B is omitted and the lead wiring 7 is formed directly on the opening 51.

In any way, connecting holes are necessary for connection of the TMR element 10 to the nearby reading transistor 15. On the other hand, usually the periphery of the connecting holes is not flat, and this disturbs the flatness of the TMR element 10. Therefore, in order to form the TMR element 10 with a flat surface, it is desirable that all the connecting holes around the TMR element 10 be arranged uniformly and remotely, instead of connecting holes such as specific reading connecting plug 30 being formed near the TMR element 10.

SUMMARY OF THE INVENTION

As mentioned above, the MRAM composed of TMR elements is a non-volatile RAM which is simple in structure and is capable of rapid writing through reversal of magnetic moment. For the high-capacity (high-integrated) memory to be produced in high yields for practical use, it is necessary that the TMR elements should be uniform in writing and reading characteristics so that the writing and reading operations can be performed with a broad margin.

One way to reduce variation in reading characteristics is to make uniform the connecting area (or projected area) of the tunnel barrier layer held between the magnetization free layer (memory layer) and the magnetization pinned layer in each TMR element constituting the memory cell, thereby minimizing variation in resistance. This leads to improvement in yields.

FIG. 19 is a graph showing an example of the distribution of reading resistance of TMR elements. Assuming that the difference is the same between the average resistance value in the "0" state and the average resistance value in "1" state, the operating margin will be large and the yield will be high if the dispersion of reading resistance is reduced. Also, for the same design margin, the TMR element will permit a higher signal voltage and faster operation.

One way to improve the writing characteristics is to reduce dispersion of $H_s$ (or one-way reversing magnetic field) of individual TMR elements 10 constituting the memory cell. This is necessary to realize a high-capacity memory. As explained above with reference to the asteroid curve shown in FIG. 12, $H_s$ with a broad dispersion reduces the range of the combined magnetic field to be applied for writing in the TMR element. This is illustrated in FIG. 20. The narrow range of the combined magnetic field prevents stable writing in all TMR elements included in one MRAM device. This is a hindrance to a high-capacity memory device.

The magnitude of $H_s$ (or one-way reversing magnetic field) depends mainly on the shape anisotropy of the magnetization free layer (memory layer) 2 so long as the material of the magnetization free layer (memory layer) 2 is the same. Therefore, to minimize its dispersion, it is important to control the area and aspect ratio of the magnetization free layer (memory layer) 2 of the TMR element 10.

For this reason, the step of patterning the resist layer 52 by photolithography shown in FIG. 17D is most important among the steps of fabricating memory cells of related-art MRAM. Since the exposure pattern 53 formed in this step determines, after development, the pattern of the resist mask 56, and etching through this resist mask 56 determines the shape of the TMR element 10, inaccurate patterning leads directly to TMR elements 10 with inaccurate shape.

Nevertheless, the foregoing has not been taken into full consideration for the arrangement of related-art memory cells shown in FIG. 15. That is, the arrangement shown in FIG. 15 is such that two bilaterally symmetric memory cells are paired. The result is that the TMR elements 10 are not arranged at equal intervals but two paired TMR elements are close to each other as schematically shown in FIG. 21 which shows only TMR elements 10. Placing two mask patterns close to each other causes the problem with the proximity effect that results from the scattering of irradiating light by the exposure pattern 53. The proximity effect deforms the resist mask pattern 56. This deformation takes place more easily in either of the resist patterns 56 corresponding to adjacent two TMR elements. Hence, the TMR elements formed from these resist mask patterns are subject to great variation.

Deformation due to proximity effect can be corrected by OPC (Optical Proximity Correction) method; however, this method is not sufficiently useful for TMR elements 10 which are two-dimensionally arranged and sensitive to writing and reading characteristics. Moreover, in fabrication of TMR elements 10, the plane shape of the TMR element 10 changes from the shape of the mask pattern or resist pattern due to loading effect in dry etching and shadow effect in ion milling in addition to proximity effect. As the result, the one-way reversing magnetic field fluctuates further.

The present invention was completed in view of the foregoing. It is an object of the present invention to provide a large-capacity solid-state memory device, such as MRAM, which has a minimum of variation in writing and reading characteristics in the information storage part. The memory device is highly reliable and capable of production in high yields. This object is achieved by making the resist mask pattern corresponding to the information storage part in such a way as to keep its deformation uniform.

The present invention is directed to a solid-state memory device having information storing parts arranged two-dimensionally, wherein said arrangement conforms to a pattern of translational symmetry. The present invention is directed also to a way of arrangement for solid-state memory cells.

The present invention produces the following effects. The information storing parts are so arranged as to conform to a pattern of translational symmetry. In other words, the information storing parts and their peripheral parts are arranged such that their relative positions are identical throughout the entire array. The arrangement in this manner prevents the proximity effect from occurring significantly in specific parts during lithography to form the resist mask pattern corresponding to the shape of the information storing parts.

According to the present invention, the proximity effect due to lithography uniformly occurs in the resist mask pattern corresponding to the individual information storing parts. Moreover, in the subsequent steps, the loading effect due to dry etching and the shadow effect due to ion milling also occur uniformly in the individual information storing parts. This prevents variation in the shape of the information storing parts. This in turn leads to uniform writing and reading characteristics in the information storing parts. Thus, the present invention realizes efficient production of reliable high-capacity solid-state memory devices.

The present invention is applicable to magnetic memory devices composed of arrayed magnetic memory elements as the information storing parts, each including a magnetization pinned layer in which the direction of magnetization is fixed, a tunnel barrier layer, and a magnetization free layer in which the direction of magnetization is variable, which layers are formed one on top of the other. The present invention produces the same effect as mentioned above when applied to DRAM (Dynamic Random Access Memory) in which the information storing parts are capacitors driven by MOS (Metal Oxide Semiconductor) transistors, because the capacitors are formed by lithography. The same holds true for SRAM (Static Random Access Memory), FRAM (Ferroelectric Random Access Memory), PROM (Programmable ROM), and EPROM (Erasable and Programmable ROM).

The present invention is applicable to MRAM as a high-speed, non-volatile, high-capacity memory indispensable in the age of ubiquitous computing. The MRAM is suitable for all kinds of electronic devices, particularly portable terminals of personal communications equipment, which require high integration, high speed, and low power consumption.

The above and other objects, features and advantages of the present invention will become apparent from the following description and the appended claims, taken in conjunction with the accompanying drawings in which like parts or elements are denoted by like reference symbols.

BRIEF DESCRIPTION OF THE DRAWINGS

FIG. 16 is a sectional view showing the relative positions of memory cells in MRAM of related art.

DETAILED DESCRIPTION OF THE PREFERRED EMBODIMENTS

Figure 1:
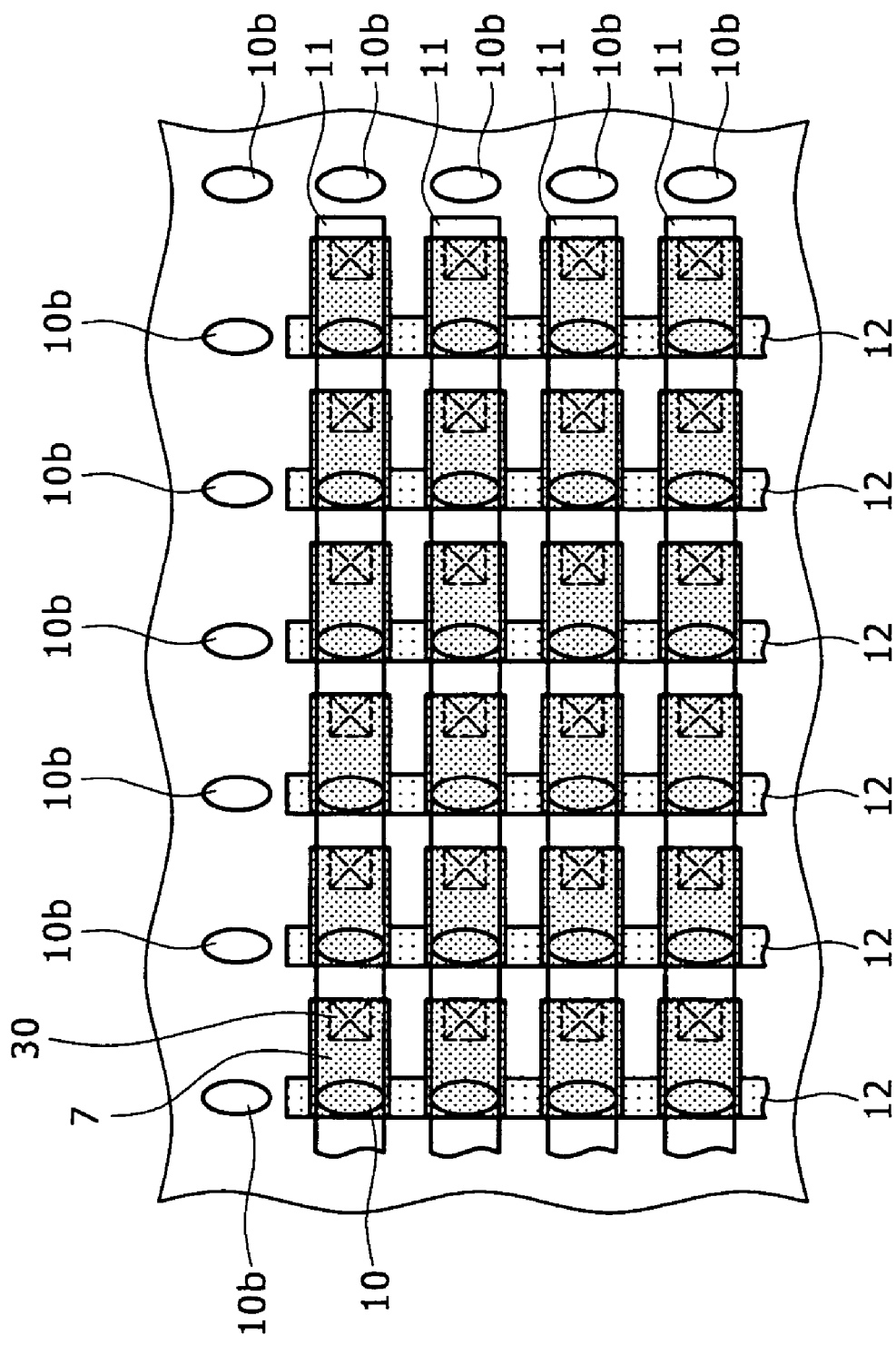
FIG. 1 is a plan view showing the arrangement of memory cells in MRAM according to the first embodiment of the present invention.

The present invention produces its best effect when it is applied to a magnetic memory device in which the information storing parts are composed of arrayed magnetic memory elements, each including a magnetization pinned layer in which the direction of magnetization is fixed, a tunnel barrier layer, and a magnetization free layer in which the direction of magnetization is variable, which layers are formed one on top of the other, with said laminate structure being driven by a first wiring electrically connected thereto and by a second wiring electrically isolated therefrom. The effectiveness of the present invention originates from the fact that the magnetic memory elements have the writing and reading characteristics which are sensitive to the two-dimensional pattern of arrangement of the laminate structures.

According to the present invention, the pattern of arrangement of the laminate structures should preferably have an axis of line symmetry and the adjacent laminate structures should preferably be arranged symmetrical about the axis of line symmetry.

The adjacent two laminate structures may also be arranged such that one of them is shifted half a pitch in the direction along the second wiring. The effect of arrangement in this manner is that connecting holes around the magnetic memory element can be arranged uniformly away from the magnetic memory element, as explained later with reference to the drawing in Embodiment 2. In this way it is possible to protect as much as possible the shape of the magnetic memory element from being affected by the irregular surface shape that is formed by the connecting holes.

It is also desirable that the first wiring and the second wiring intersect orthogonally with each other and that the pattern of the laminate structures has an axis of line symmetry, which intersects with the first or second wiring at an angle of 0°, 90°, 180°, or 270°. This arrangement permits toggle-mode writing in the magnetic memory element. Toggle-mode writing obviates the necessity of reversing the direction of writing current, which simplifies the driving circuits and increases the writing speed. Moreover it is possible to form the writing wiring and the reading wiring independently from each other, which makes it possible to perform writing and reading almost independently.

In this case, the pattern of the connecting holes to connect the lead wiring of the laminate structure to the lower layer wiring should also have an axis of line symmetry, so that adjacent connecting holes are arranged symmetrical about the axis of line symmetry. This produces the same effect as mentioned above. That is, connecting holes around the magnetic memory element are arranged uniformly away from the magnetic memory element, so as to protect as much as possible the shape of the magnetic memory element from being affected by the irregular surface shape that is formed by the connecting holes.

The regions of array of the laminate structures should preferably be surrounded by a dummy pattern of the same shape of the laminate structure. The effect of arrangement in this manner is that the laminate structures at the outermost sides of the array are apparently surrounded by the laminate structures in the same way as the laminate structures inside the array. This makes it possible to fabricate the laminate structures at the outermost sides of the array under the same condition as the laminate structures inside the array.

The MRAM according to the present invention should preferably be constructed as follows. The magnetization free layer and the magnetization pinned layer are separated by the tunnel barrier layer interposed between them. Information is written by magnetizing the magnetization free layer in a specified direction. This magnetization is accomplished by magnetic field induced by current flowing through the bit line as the first wiring and the writing word line as the second wiring. The written information is read by using the tunnel magnetoresistance effect produced by the tunnel barrier layer. This is a standard structure of MRAM.

According to another preferred pattern of arrangement, the information storing parts have an axis of line symmetry and the adjacent information storing parts are symmetrical about the axis of line symmetry.

According to another preferred pattern of arrangement, the adjacent information storing parts are arranged such that one of them is shifted half a pitch in the direction along the wiring.

According to another preferred pattern of arrangement, the information storing parts have an axis of line symmetry and the adjacent information storing parts are aslant to the axis of line symmetry at an angle of 0°, 90°, 180°, or 270°.

According to another preferred pattern of arrangement, the region of array of the information storing parts is surrounded by a dummy pattern of the same shape as the information storing parts.

The preferred embodiments of the present invention will be described below with reference to the accompanying drawings. In the following embodiments 1 to 4, the solid-state memory device is the magnetic memory device (MRAM).

Embodiment 1

FIG. 1 is a plan view showing the arrangement of memory cells in the magnetic memory device (MRAM) according to the first embodiment. This magnetic memory device is comparable to MRAM of related art. As in FIG. 15, FIG. 1 does not show, for brevity, the wirings and the transistors for reading (selection) which are formed in the lower layer.

Figure 15:
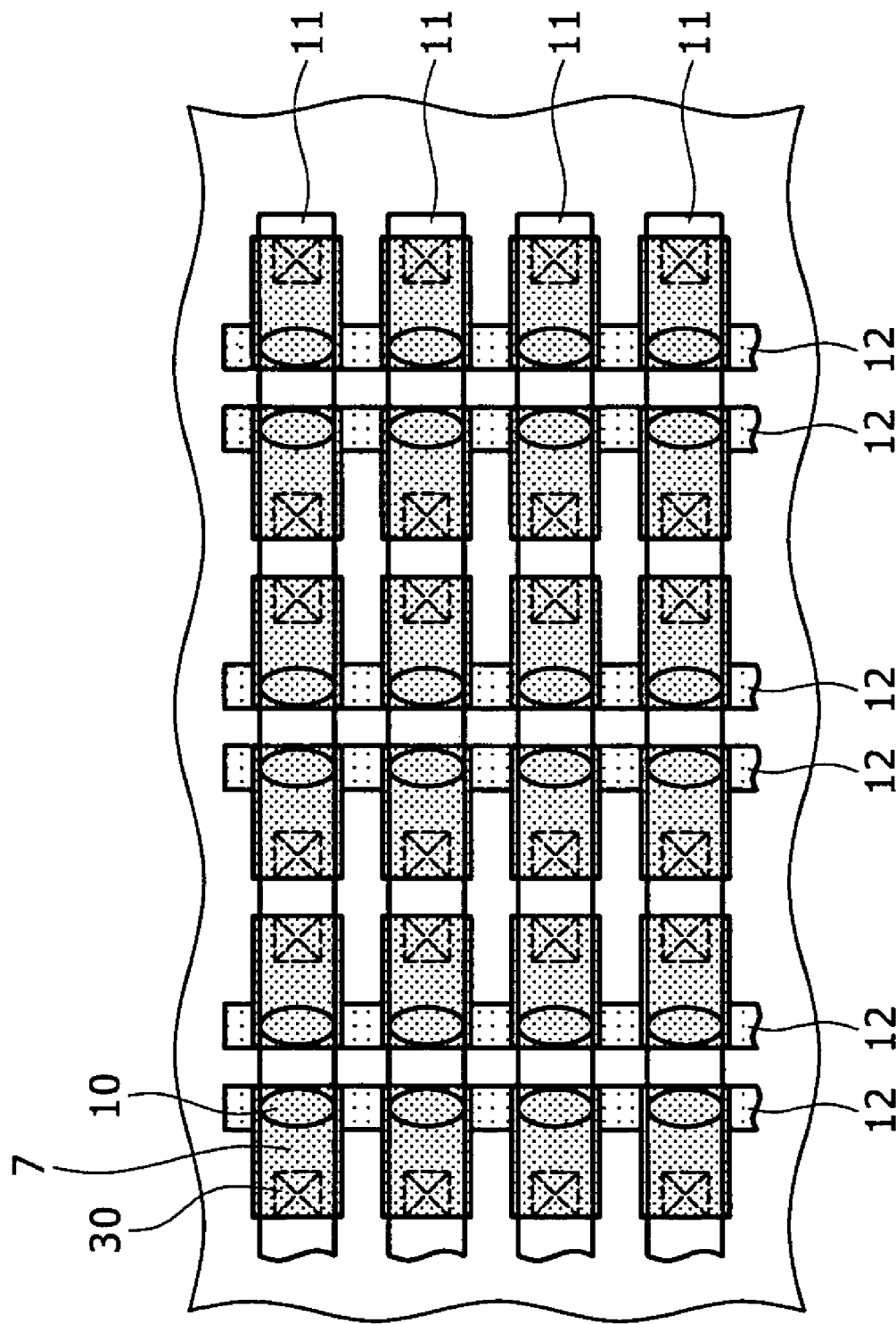
FIG. 15 is a plan view showing the arrangement of memory cells in MRAM of related art.
Figure 17A:
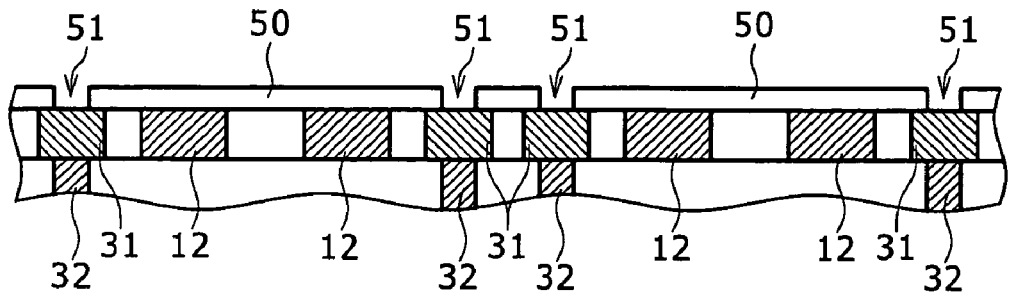
FIGS. 17A to 17D are schematic sectional views showing the fabrication steps for memory cells of MRAM of related art.
Figure 17B:
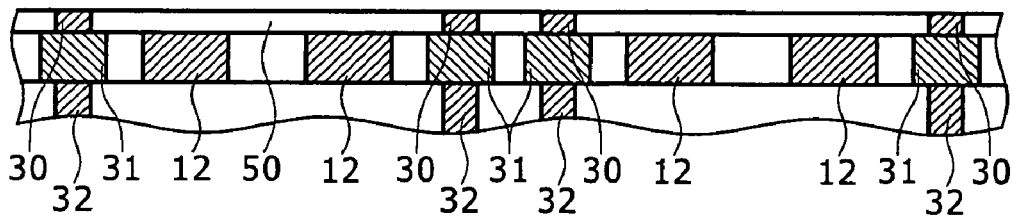
Figure 17C:
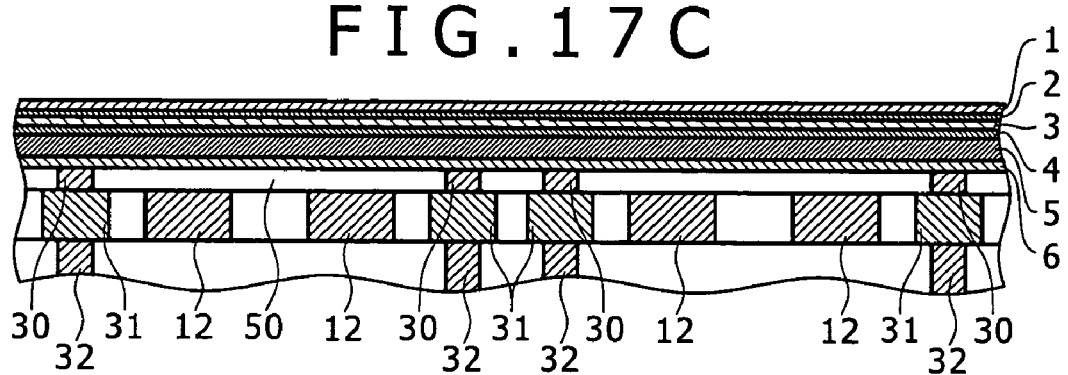
Figure 17D:
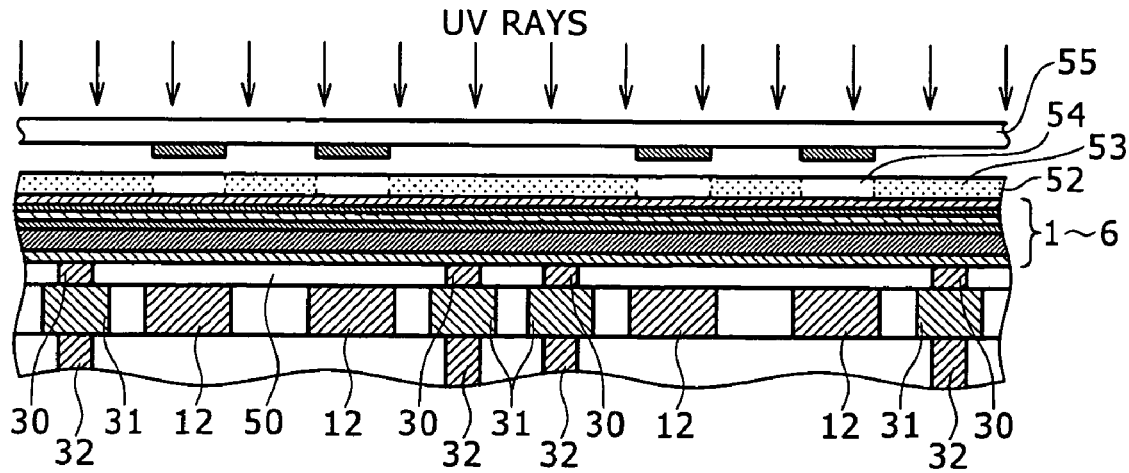
Figure 18A:
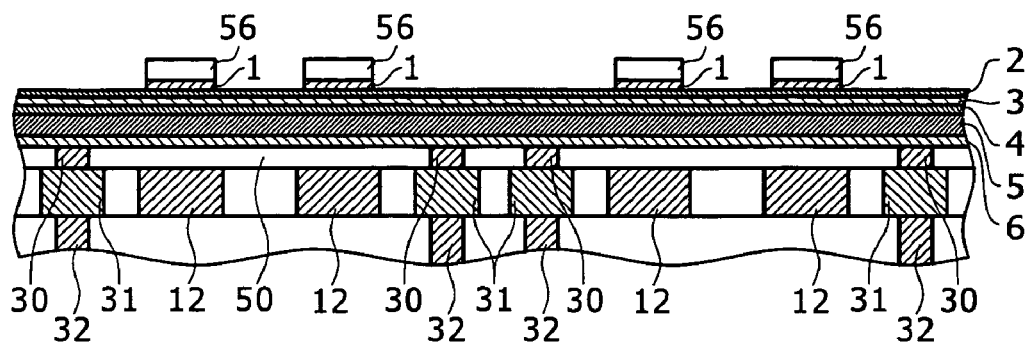
FIGS. 18A to 18D are schematic sectional views showing the fabrication steps for memory cells of MRAM of related art.
Figure 18B:
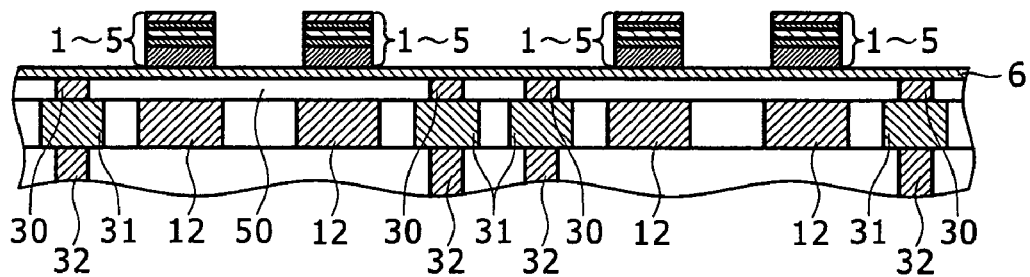
Figure 18C:
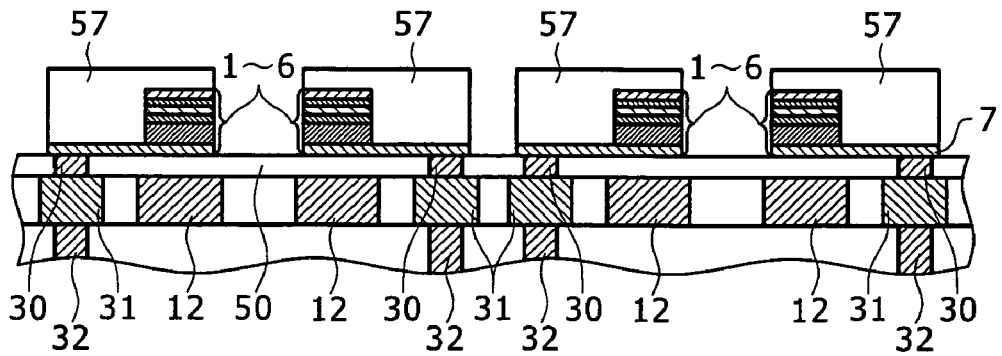
Figure 18D:
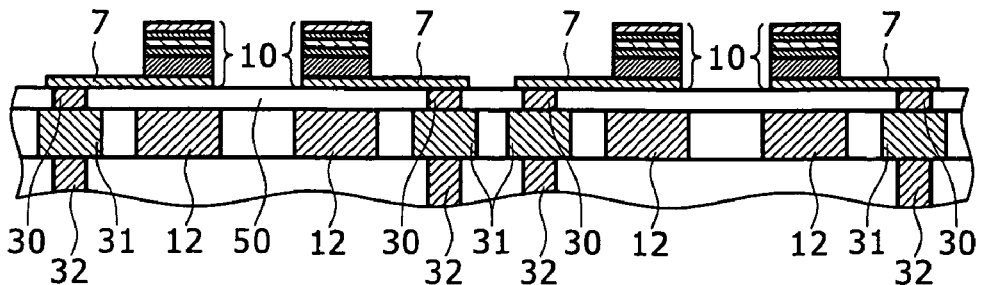
Figure 19:
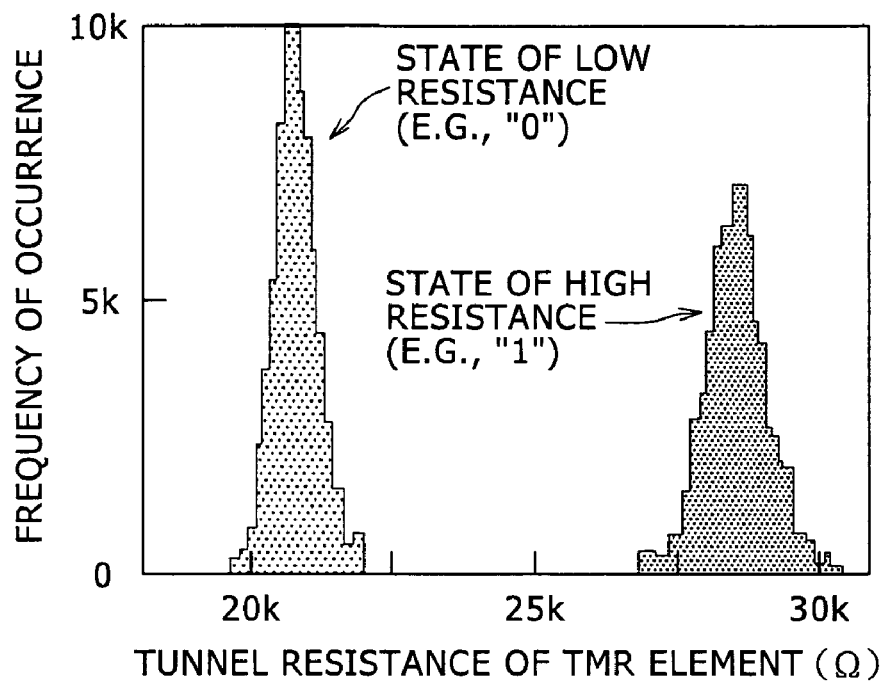
FIG. 19 is a graph showing an example of the distribution of reading resistance of TMR elements of related art.
Figure 20:
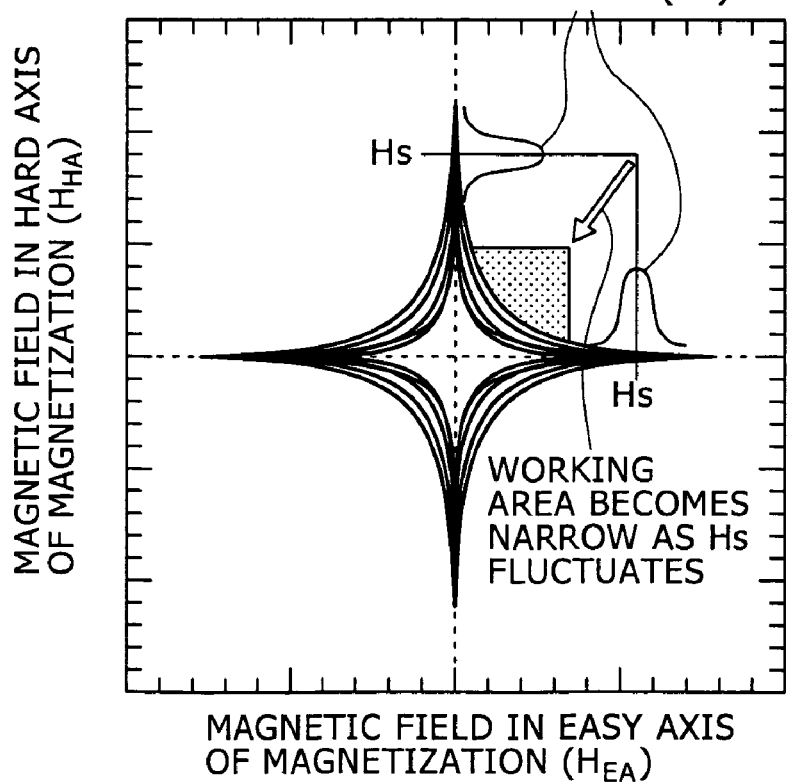
FIG. 20 is a graph showing an example of the distribution of asteroid writing characteristics of TMR elements of related art.
Figure 21:
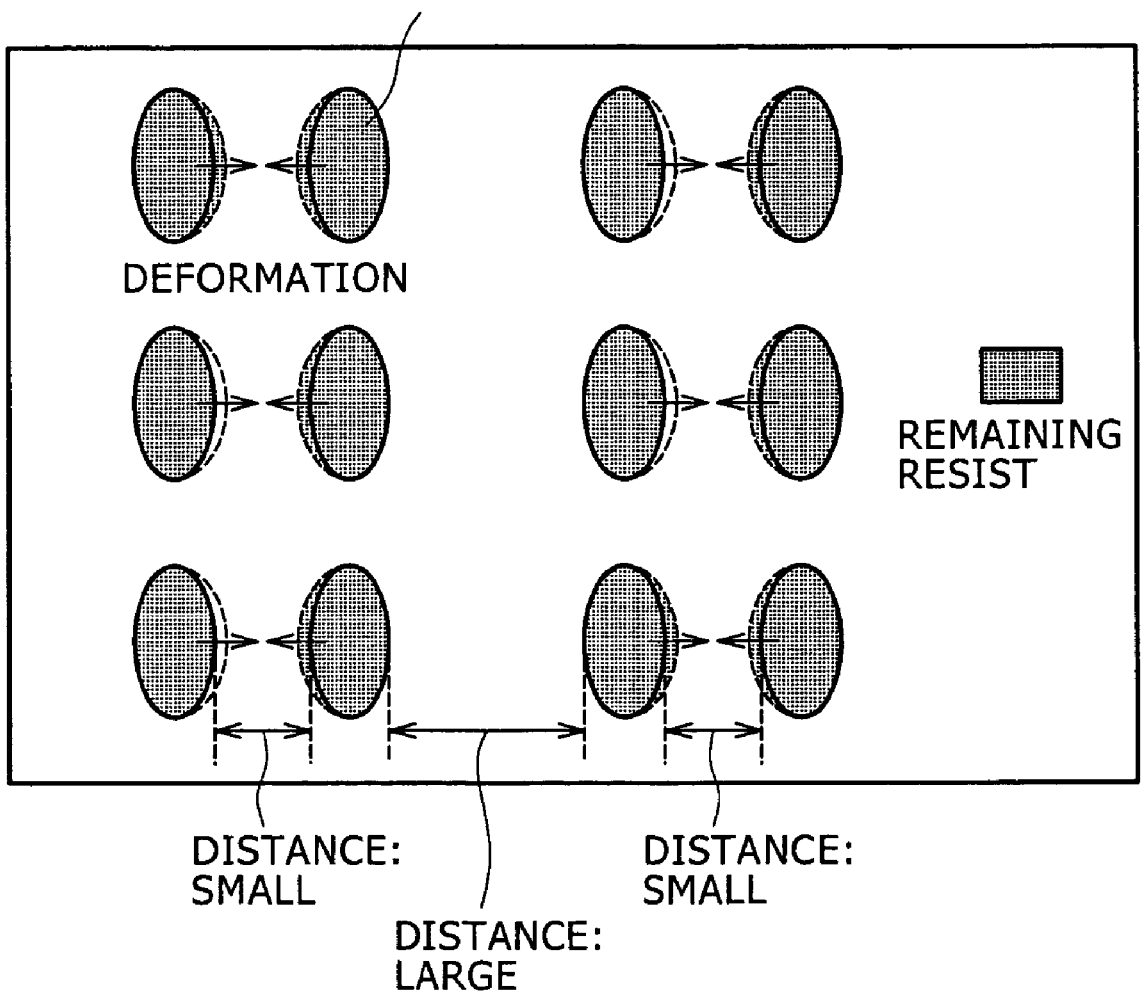
FIG. 21 is a diagram illustrating the proximity effect in the step of forming a resist mask pattern corresponding to the shape of TMR elements in fabrication of memory cells of MRAM of related art.

The MRAM shown in FIG. 1 is identical with the related-art MRAM shown in FIG. 15 in that each memory cell is that of 1T1J type which has one TMR element 10 and one transistor for reading (selection). Each memory cell also includes the lead wiring 7 which extends from the leading electrode 6 of the TMR element 10 and the reading connecting plug 30 which connects the lead wiring 7 to the drain electrode of the transistor for reading (selection). It further includes the bit lines 11 and the writing word lines 12 which are connected to individual memory cells.

The difference between the two resides in the arrangement of memory cells. In the related-art MRAM shown in FIG. 15, a large number of memory cells are arranged such that a pair of bilaterally symmetric memory cells constitute a unit. By contrast, in the MRAM shown in FIG. 1, a large number of memory cells are arranged at equal intervals in the horizontal and vertical directions such that each memory cell constitutes a unit. In other words, the arrangement has a pattern of translational symmetry.

As shown in FIG. 1, the MRAM according to this embodiment has TMR elements arranged such that the relation of one TMR element with its surrounding TMR elements is the same for any TMR element. Thus, the proximity effect is the same for all the TMR elements, and this reduces variation.

The foregoing, however, does not apply to the TMR elements 10 at the outermost sides of the array where there are no TMR elements 10 surrounding them. This problem is circumvented by forming the same dummy pattern as the TMR elements 10 in the region outside the array. The result is that the TMR elements 10 at the outermost sides of the array are also surrounded by the TMR elements 10 and the dummy elements 10b in the same way as the TMR elements 10 inside the array. Thus, the TMR elements 10 at the outermost sides of the array can be formed under the same conditions as for the TMR elements 10 inside the array. Incidentally, the array shown in FIG. 1 is based on the assumption that the dummy elements 10b are arranged at the upper side and right side of the array.

Figure 2:
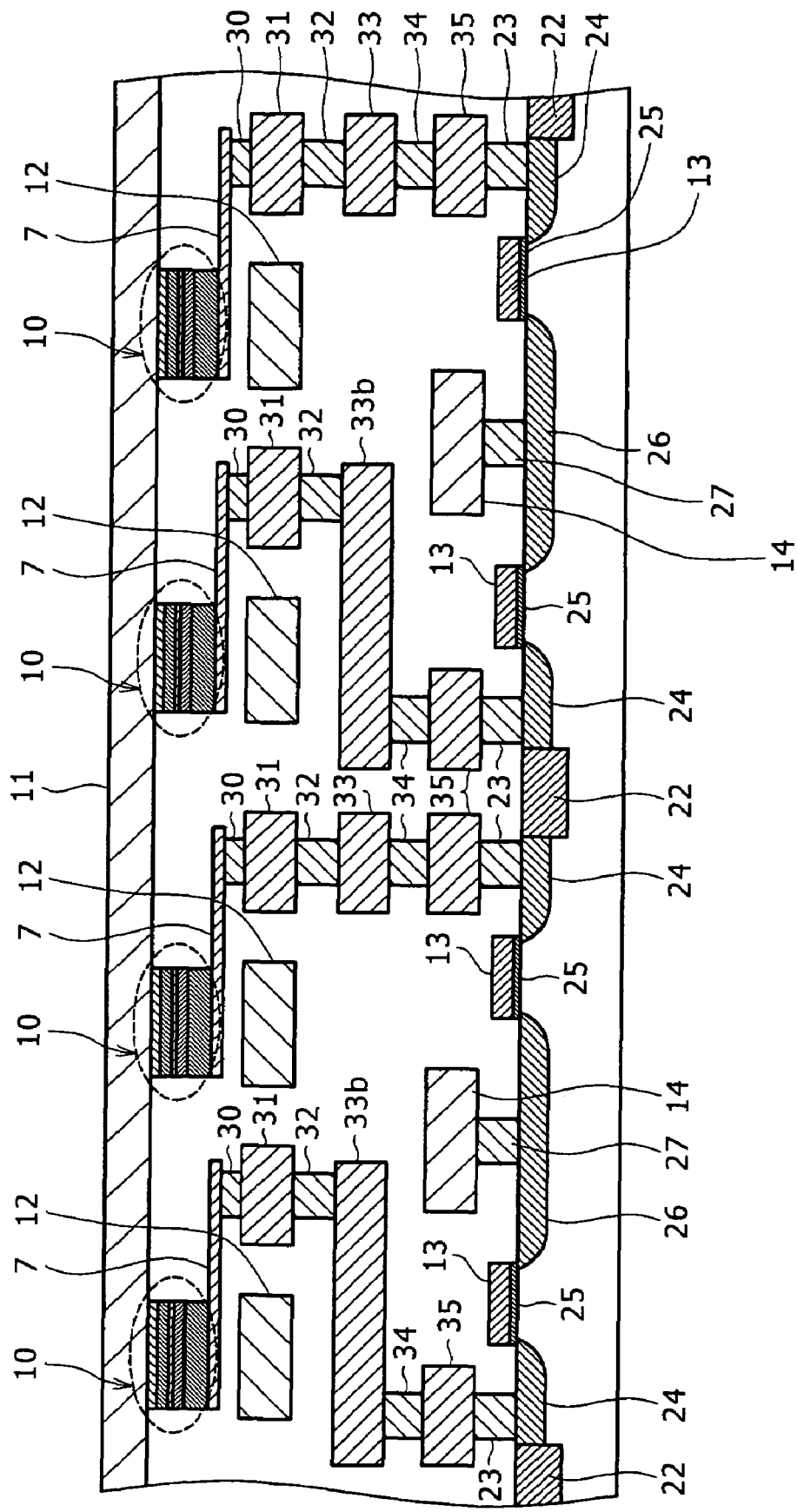
FIG. 2 is a sectional view showing the relative positions of memory cells in the same MRAM as above.

FIG. 2 is a schematic sectional view showing the relative positions of four memory cells in the MRAM mentioned above.

Each memory cell is constructed of the same elements as those in the related-art memory cell shown in FIG. 16. In other words, above the memory cell are arranged the TMR element 10, the bit line 11, and the writing word line 12, which have been mentioned above. The bit line 11, which is formed on the TMR element 10, is electrically connected to the top coat layer 1 of the TMR element 10. The writing word line 12 is formed under the TMR element 10, with an insulating layer interposed between them. Under the memory cell is the p-type silicon semiconductor substrate 20 which has the p-type well region 21. In the well region 21 is formed the n-type MOS field effect transistor 15 including the drain electrode 23, the drain region 24, the gate electrode 13, the gate insulating film 25, the source region 26, and the source electrode 27. The gate electrode 13 of the transistor 15 is a long strip connecting cells, so that it serves also as the reading word line 13. The drain electrode 23 is connected to the leading electrode layer 6 of the TMR element 10 through the leading wiring 7, the reading connecting plugs 30, 32, and 34 and the reading landing pads 31, 33, and 35. The source electrode 27 is connected to the sense line 14.

Figure 6:
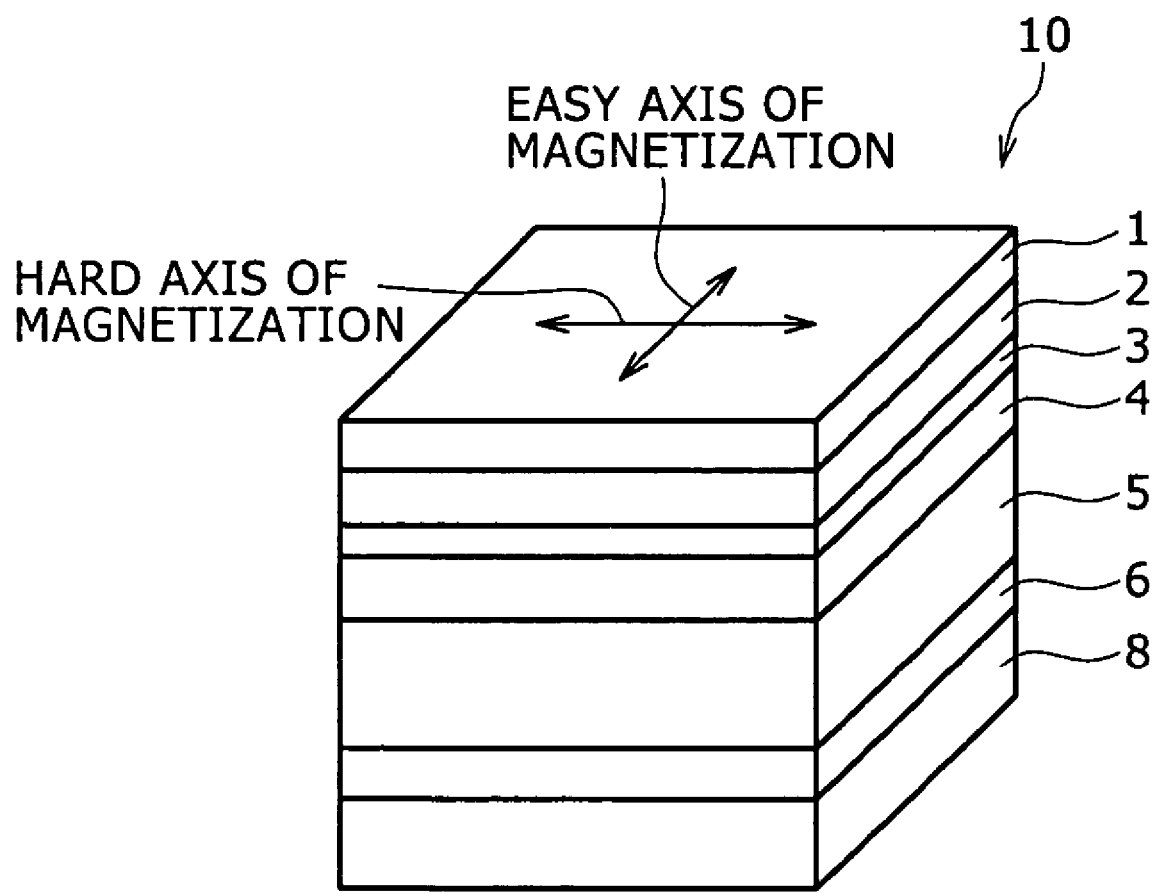
FIG. 6 is a schematic perspective view of a TMR element of the MRAM.
Figure 7:
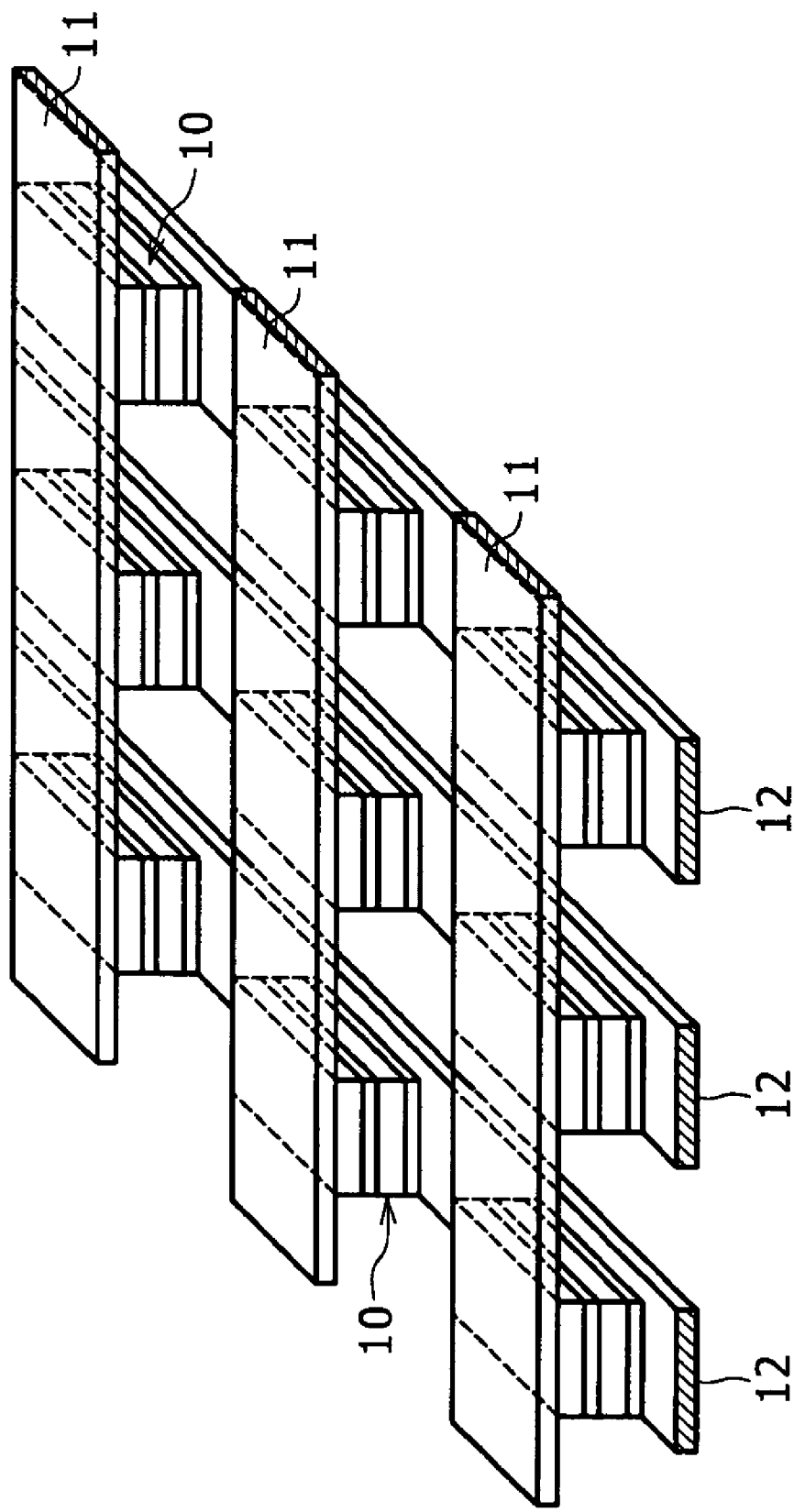
FIG. 7 is a schematic perspective view showing a portion of memory cells of the MRAM.
Figure 8:
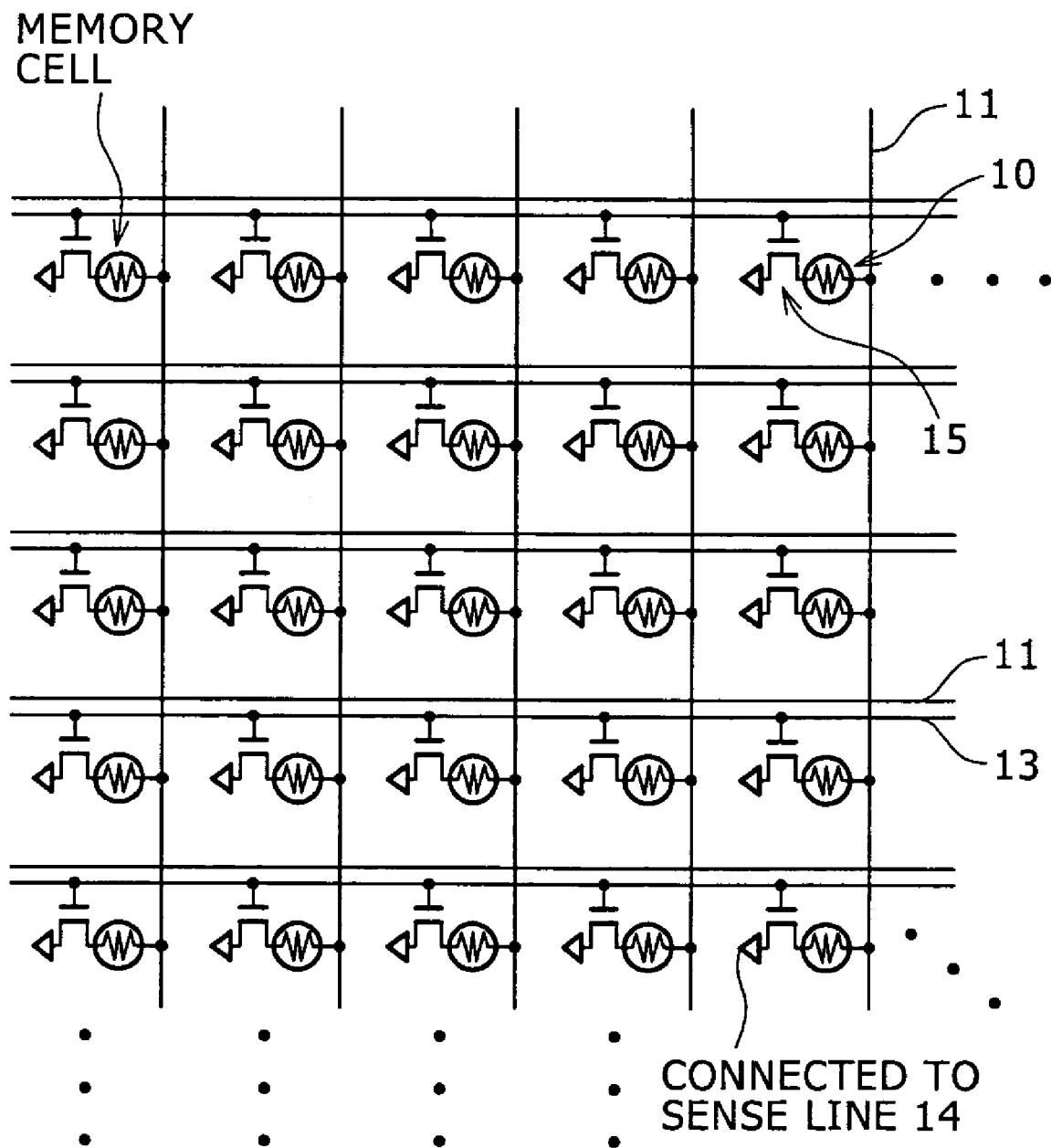
FIG. 8 is a diagram of equivalent circuits of the MRAM.
Figure 9:
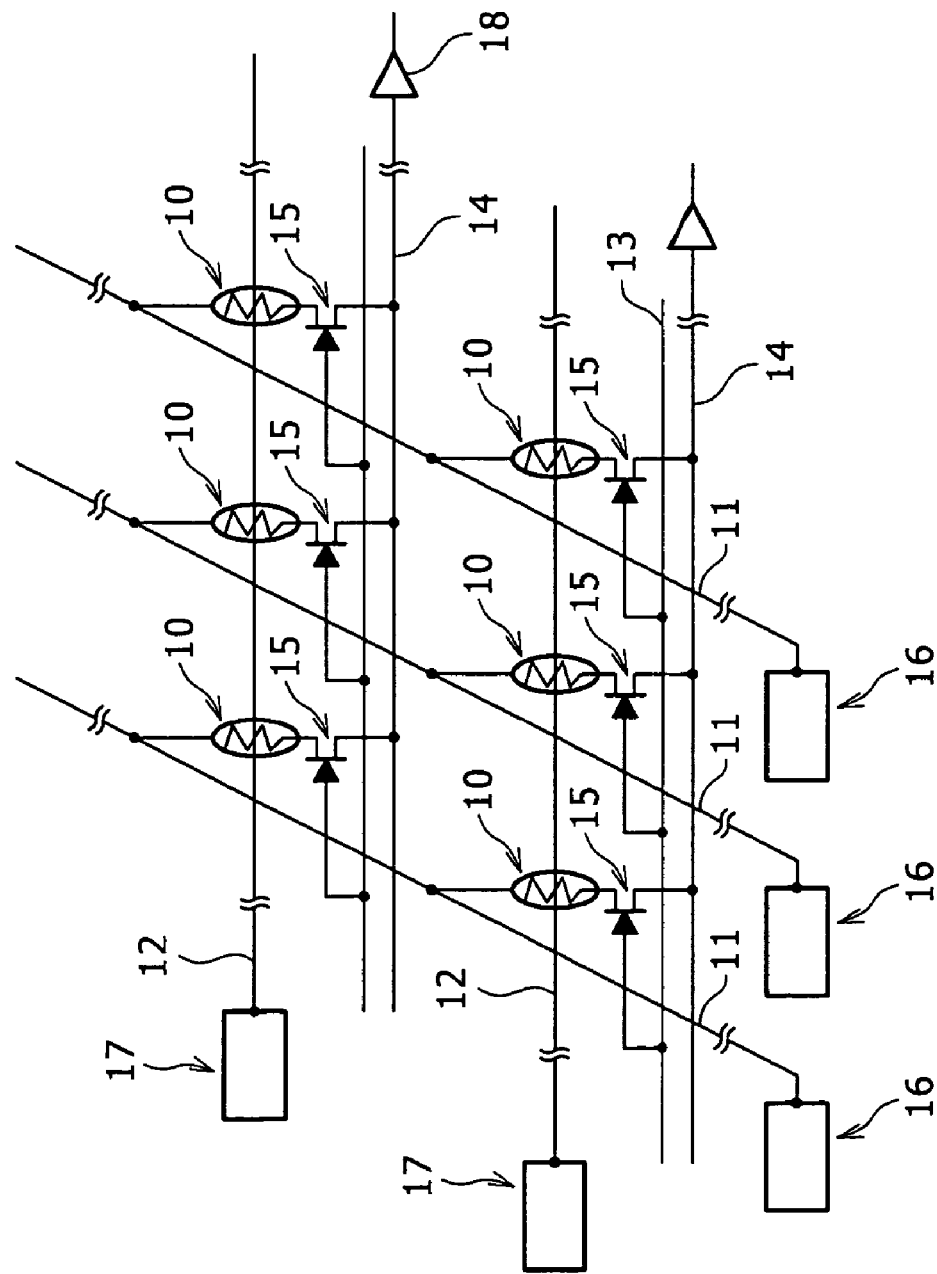
FIG. 9 is a diagram of equivalent circuits of the MRAM.
Figure 10:
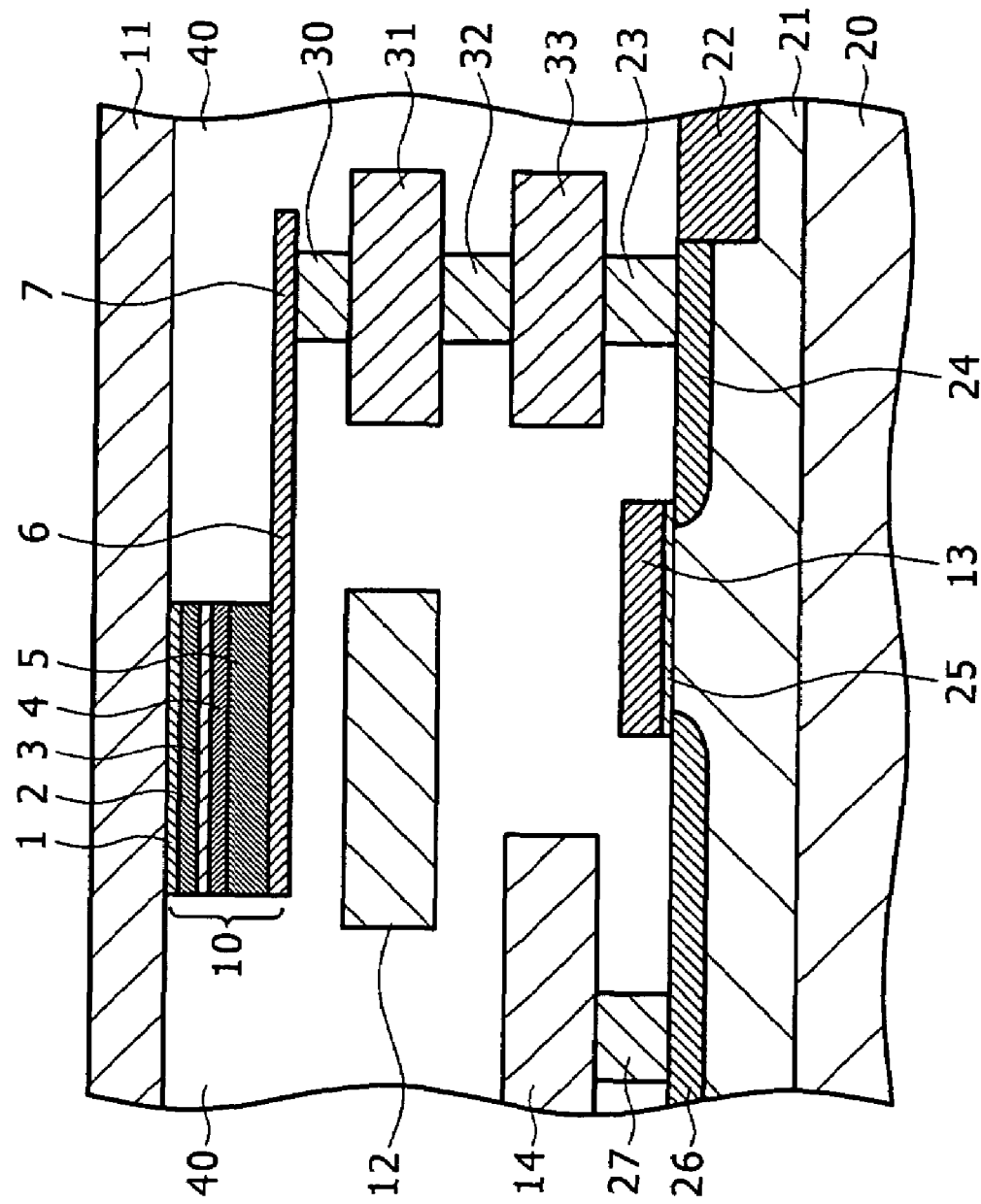
FIG. 10 is a schematic sectional view of a memory cell of MRAM of related art.
Figure 11:
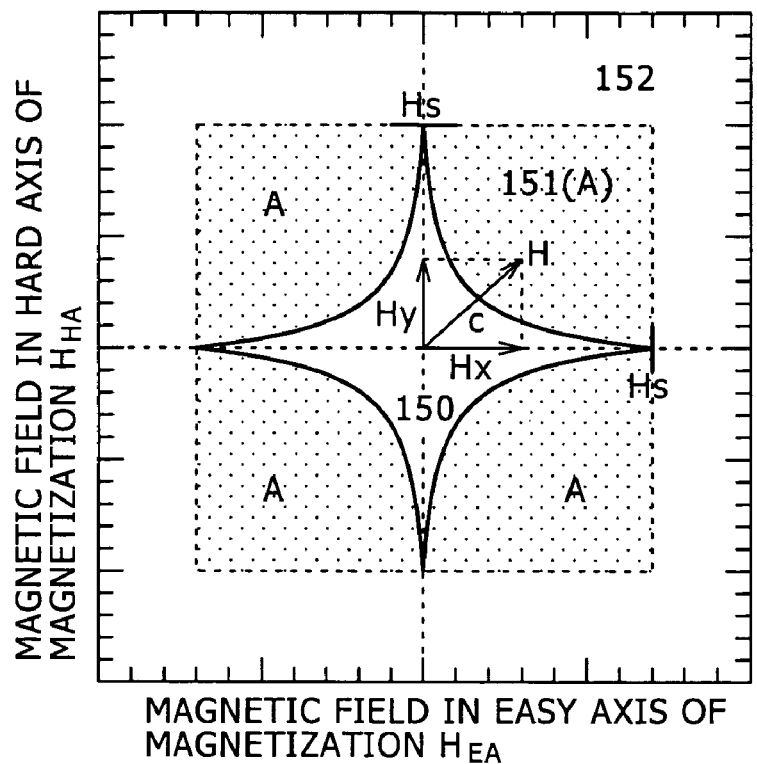
FIG. 11 is a diagram showing the magnetic field response characteristics at the time of writing in a TMR element.
Figure 12:
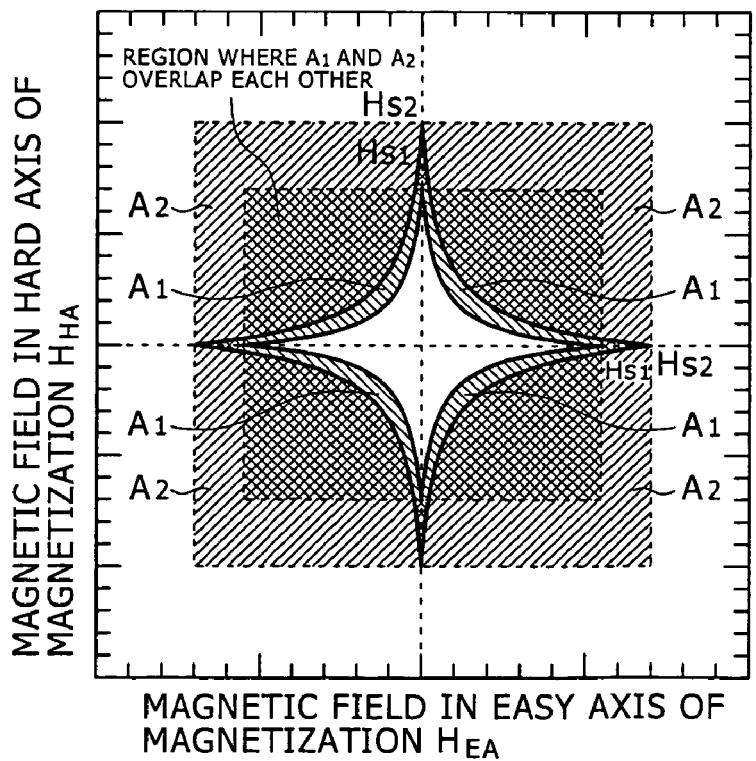
FIG. 12 is a diagram showing the two magnetic field response characteristics at the time of writing in a TMR element.
Figure 13:
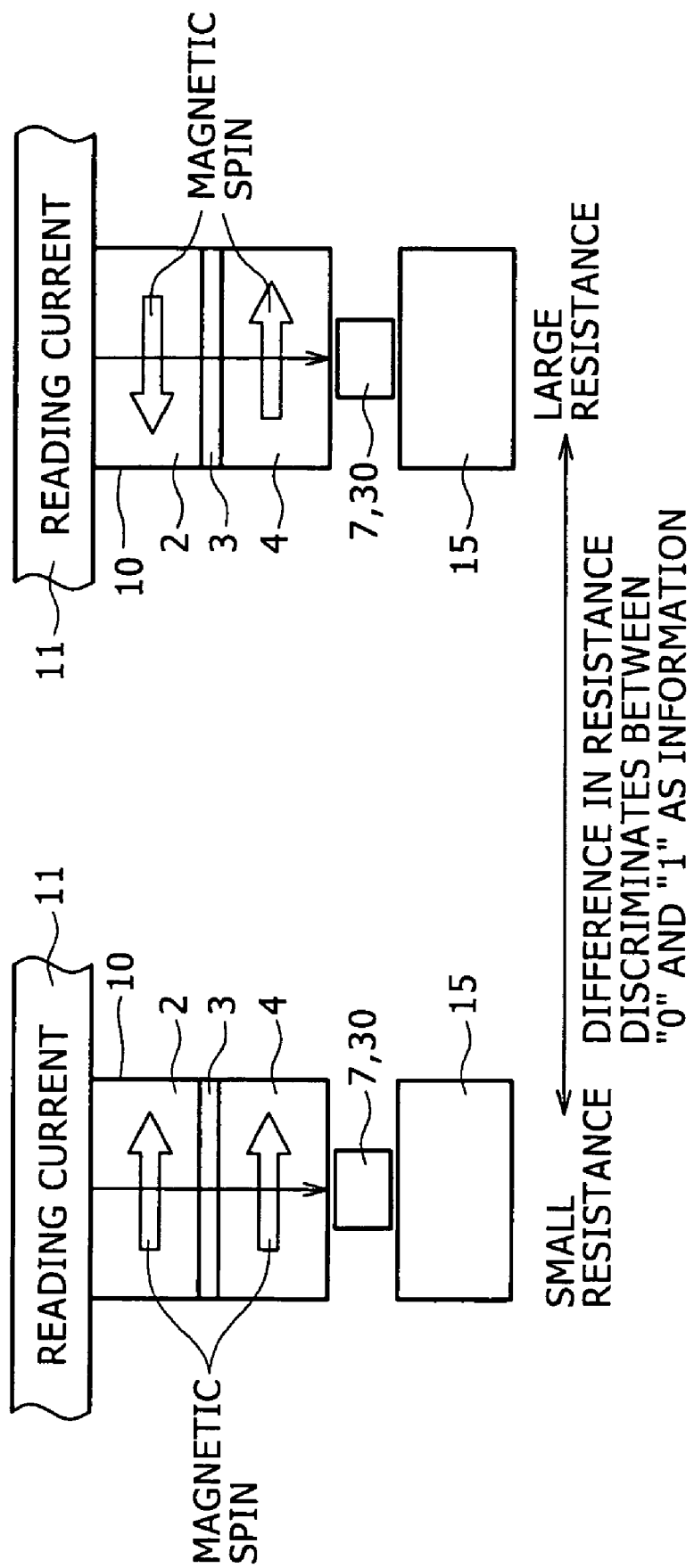
FIG. 13 is a diagram showing the principle of reading from a TMR element.
Figure 14:
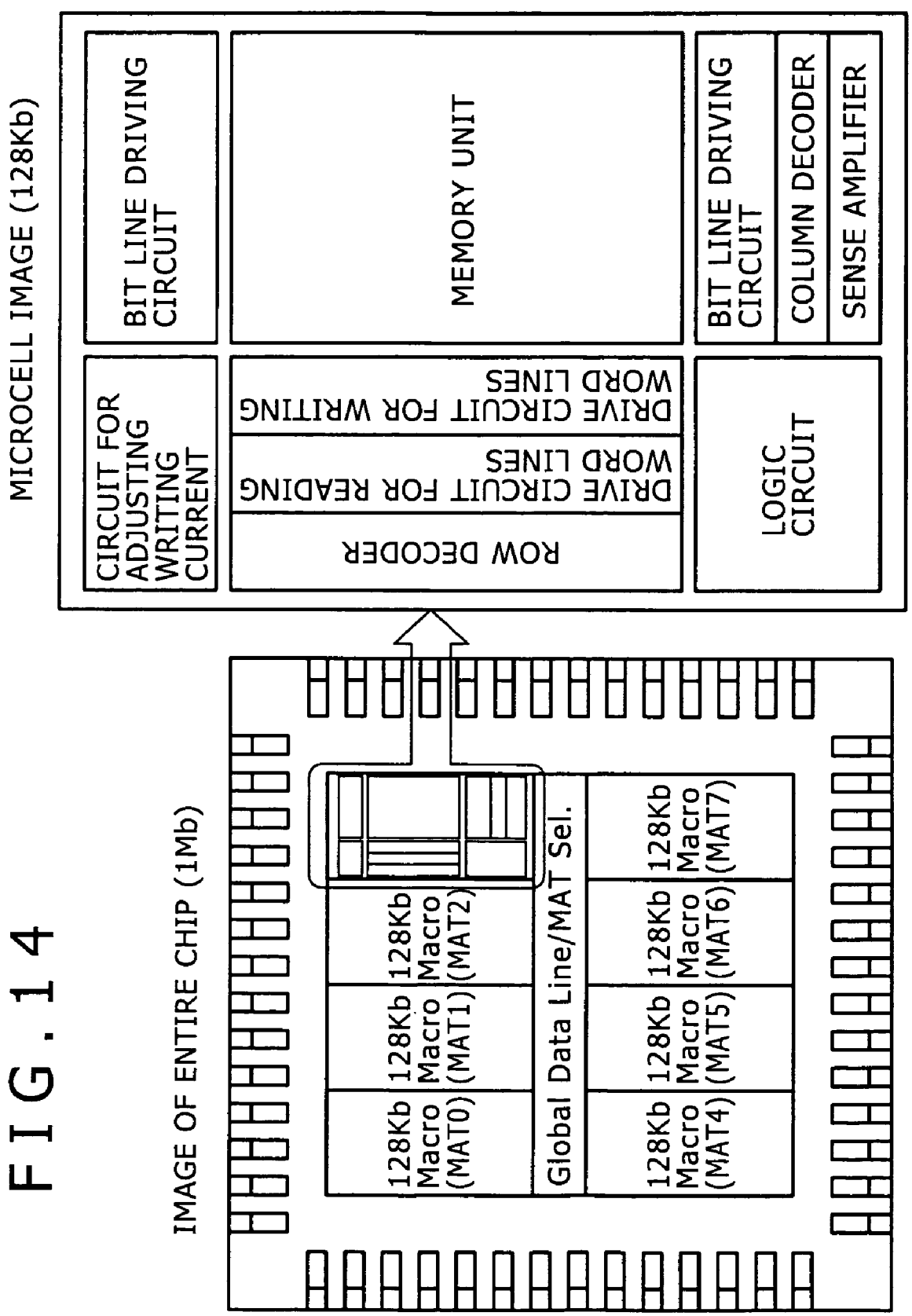
FIG. 14 is a diagram showing the arrangement of components in a 1M bit MRAM.

The TMR element 10 has the same structure as the related-art shown in FIG. 6. The TMR element 10 is formed on the supporting substrate 8 which is an insulating layer in this case. It includes the magnetization free layer (memory layer) 2, in which the direction of magnetization is reversed comparatively easily, and the magnetization pinned layer 4, in which the direction of magnetization is fixed. These two layers are formed from a ferromagnetic material composed mainly of nickel, iron, cobalt, or alloy thereof. The magnetization pinned layer 4 may be a multi-layered film (or a laminate film composed of ferromagnetic material, metal, and ferromagnetic material) which has SAF (Synthetic Antiferromagnet) coupling.

The magnetization pinned layer 4 is in contact with the antiferromagnetic layer 5. These two layers produce an exchange interaction, which imparts strong magnetic anisotropy to the magnetization pinned layer 4. The antiferromagnetic layer 5 is formed from a manganese alloy of iron, nickel, platinum, iridium, or rhodium, or an oxide of cobalt or nickel.

The magnetization free layer (memory layer) 2 has the axis of easy magnetization (or the axis along which the ferromagnetic material is easily magnetized) which is parallel to the direction of magnetization of the magnetization pinned layer 4. Therefore, it is magnetized easily in the direction parallel or antiparallel to the direction of magnetization of the magnetization pinned layer 4, so that the direction of magnetization is easily reversed between these two states. Consequently, the magnetization free layer (memory layer) 2 can be used as an information storage medium if its two states of magnetization ("parallel" and "antiparallel" to the direction of magnetization of the magnetization pinned layer 4) are made to correspond to "0" and "1" representing information.

Between the magnetization free layer (memory layer) 2 and the magnetization pinned layer 4 is interposed a tunnel barrier layer 3 formed from an insulating material such as an oxide or nitride of aluminum, magnesium, or silicon. It cuts off the magnetic coupling between the two layers 2 and 4, and it also permits tunnel current to flow in response to the direction of magnetization of the layer 2. The magnetic layer and the conducting layer constituting the TMR element 10 are formed mainly by sputtering. The tunnel barrier layer 3 may be formed by oxidizing or nitriding the metal film which has been formed by sputtering.

The top coat layer 1 prevents mutual diffusion between the TMR element 10 and the wiring connected thereto. It also reduces contact resistance and protects the magnetization free layer (memory layer) 2 from oxidation. It is usually formed from copper, tantalum, titanium, or titanium nitride. The leading electrode layer 6 serves for connection between the TMR element 10 and a switching element connected thereto in series. This leading electrode layer 6 may function also as the antiferromagnetic layer 5.

The difference between the memory cell mentioned above and the related-art memory cell shown in FIG. 16 is that the adjacent two memory cells share the source region 26, the source electrode 27, and the sense line 14, so that the reading landing pad 33 for one memory cell serves as the reading wiring 33b for the other memory cell.

It is assumed that the MRAM shown in FIG. 2 has four-layer metal wiring as in the case of MRAM shown in FIG. 15, although three-layer metal wiring performs fundamental functions required of the MRAM cell array. The reason for this is that the metal wiring in four or more layers has been adopted for most high-speed memory circuits or logic circuits in the devices conforming to the recent design rule for 0.18 m.

It is understood from comparison between FIG. 2 and FIG. 16 that the related-art. MRAM shown in FIG. 16 is composed of paired memory cells which are bilaterally symmetrical in both the upper and lower parts. The symmetrical structure in the lower part has been adopted to simplify the wiring, and it has caused the upper TMR elements 10 to be arranged in a pattern of bilateral symmetry. By contrast, in this embodiment, the memory cell is provided with the reading landing pad 33b. Owing to the reading landing pad 33b, the lower structure remains bilaterally symmetrical as in the related-art for simple wiring. However, the arrangement of the upper structure is changed to a pattern of translational symmetry. Thus, the bilateral symmetry is most suitable for the lower structure and the translational symmetry is most suitable for the upper structure.

Embodiment 2

Figure 3:
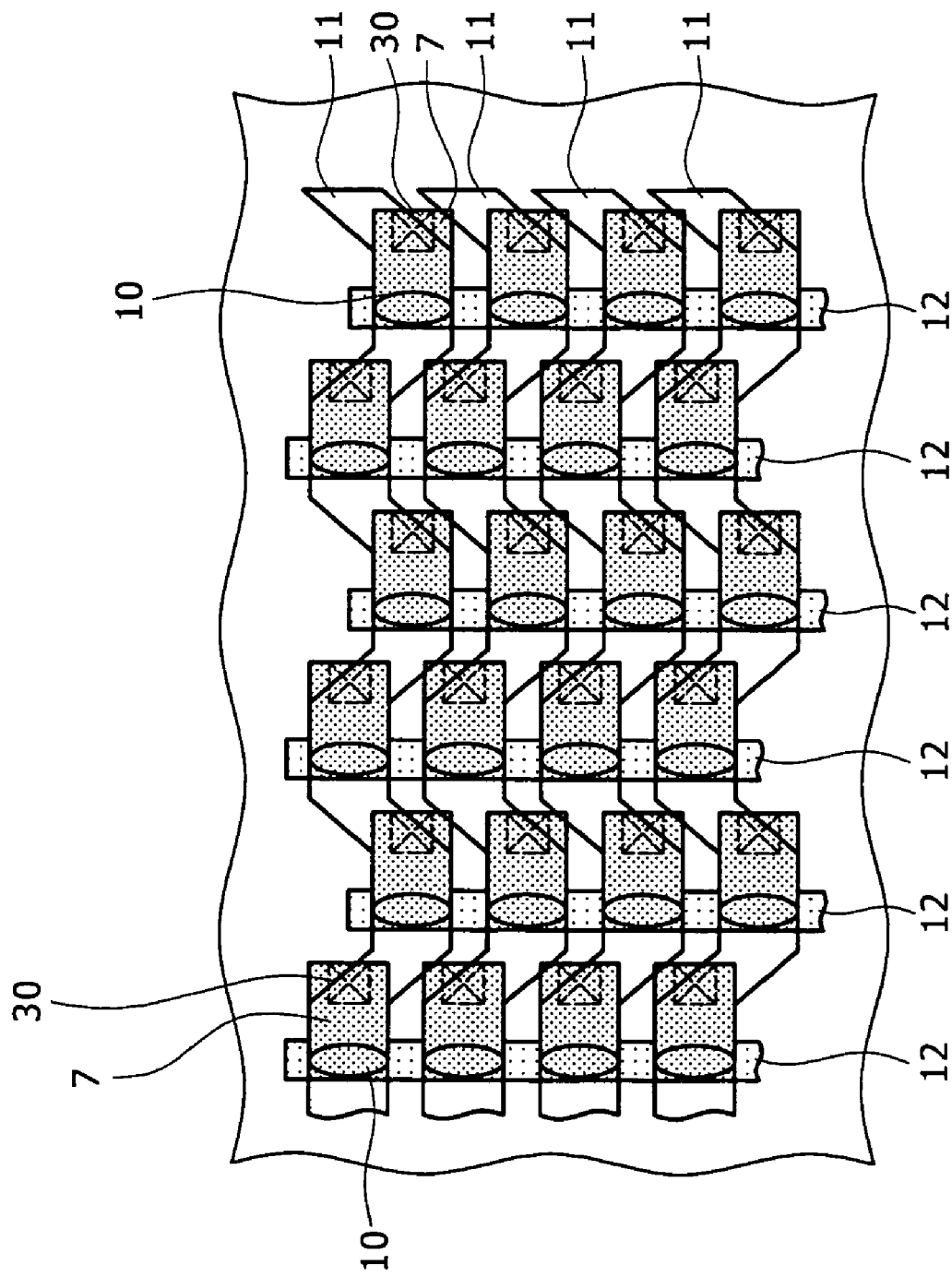
FIG. 3 is a plan view showing the arrangement of memory cells in MRAM according to the second embodiment of the present invention.

FIG. 3 is a plan view showing the arrangement of memory cells in the magnetic memory device (MRAM) according to the second embodiment.

The MRAM shown in FIG. 3 is identical with the MRAM shown in FIG. 1 according to Embodiment 1 in that each memory cell is that of 1T1J type which has one TMR element 10 and one transistor for reading (selection). Each memory cell also includes the lead wiring 7 which extends from the leading electrode 6 of the TMR element 10 and the reading connecting plug 30 which connects the lead wiring 7 to the drain electrode of the transistor for reading (selection). It further includes the bit lines 11 and the writing word lines 12 which are connected to individual memory cells. As in FIG. 1, FIG. 3 does not show, for brevity, the wirings and the transistors for reading (selection) which are formed in the lower layer.

This embodiment differs from Embodiment 1 in the way of arrangement. In Embodiment 1, the TMR elements 10 in all the columns are arranged at the same position in the direction along the writing word line 12. In Embodiment 2, however, the TMR elements 10 in the columns along the writing word line 12 are arranged such that those in one column are shifted half a pitch from those in its adjacent column.

The arrangement according to Embodiment 1 is formed in such a way that the TMR elements 10 in one column are aligned with those in its adjacent column in the direction along the writing word line 12. As the result, the reading connecting plugs 30 for the memory cells in the left column are close to the TMR elements 10 in the right column. As mentioned above, the surface state is often disturbed in the region where the reading connecting plugs 30 are formed, and the disturbed surface state easily affects the TMR elements 10 in the arrangement according to Embodiment 1.

By contrast, the arrangement according to Embodiment 2 is formed such that the TMR elements 10 in one column are shifted half a pitch from those in its adjacent column in the direction along the writing word line 12. As the result, the reading connecting plugs 30 for the memory cells in the left column are away from the TMR elements 10 in the right column. Thus, the arrangement according to Embodiment 2 offers the advantage that the TMR elements 10 are less affected by the disturbed surface state in the region where the reading connecting plugs 30 are formed.

Other advantages in Embodiment 2 are the same as those in Embodiment 1. That is, the TMR elements are arranged such that the relation of one TMR element with its surrounding TMR elements is the same for any TMR element. Thus, the proximity effect is the same for all the TMR elements, and this reduces variation.

Although not shown in FIG. 3, it is desirable that the region in which memory cells are arranged be surrounded by the dummy pattern of the same shape as the TMR elements 10, so that the TMR elements 10 at the outermost sides of the array can be formed under the same conditions as for the TMR elements 10 inside the array.

Embodiment 3

Figure 4:
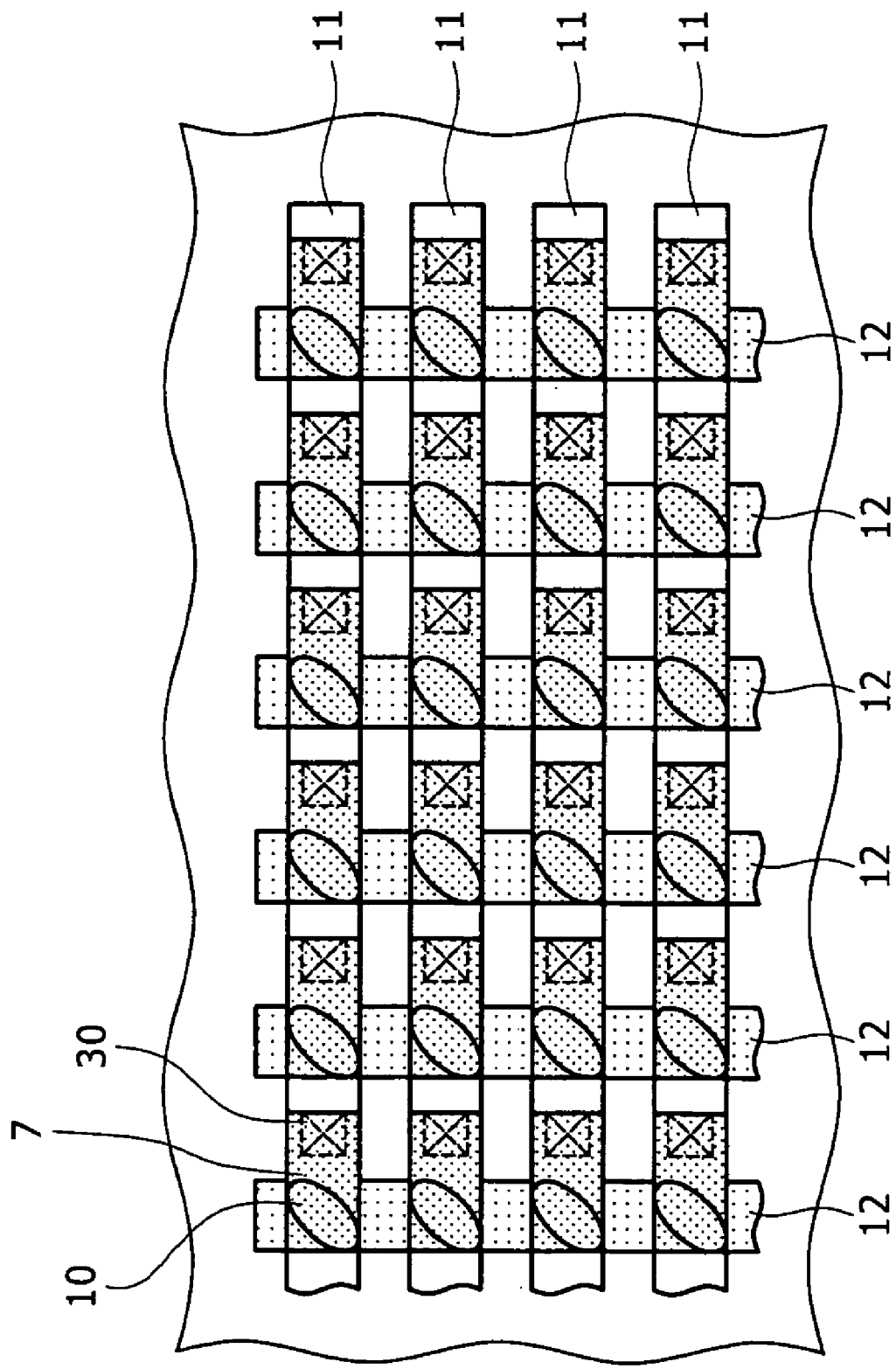
FIG. 4 is a plan view showing the arrangement of memory cells in MRAM according to the third embodiment of the present invention.

FIG. 4 is a plan view showing the arrangement of memory cells in the magnetic memory device (MRAM) according to this embodiment. The MRAM shown in FIG. 4 is identical with the MRAM shown in FIG. 1 according to Embodiment 1 in that each memory cell is that of 1T1J type which has one TMR element 10 and one transistor for reading (selection). Each memory cell also includes the lead wiring 7 which extends from the leading electrode 6 of the TMR element 10 and the reading connecting plug 30 which connects the lead wiring 7 to the drain electrode of the transistor for reading (selection). It further includes the bit lines 11 and the writing word lines 12 which are connected to individual memory cells. As in FIG. 1, FIG. 4 does not show, for brevity, the wirings and the transistors for reading (selection) which are formed in the lower layer.

The difference between Embodiment 3 and Embodiment 1 resides in the way of arrangement. The arrangement in Embodiment 1 is such that the long axis of the pattern of the TMR element 10 is oriented so that it intersects the bit line 11 at right angles, whereas the arrangement in Embodiment 3 is such that the long axis of the pattern of the TMR element 10 is oriented so that it is aslant 45° to the bit line 11 and the writing word line 12. The TMR elements 10 with orientation in this manner are capable of toggle-mode writing disclosed in U.S. Pat. No. 6,543,906.

The TMR element 10 to be used in toggle mode has a magnetization free layer of SAF three-layer structure (or a laminate film composed of ferromagnetic layer, antiferromagnetic layer, and ferromagnetic layer), which is formed such that the upper ferromagnetic layer and the lower ferromagnetic layer are magnetized in the mutually opposite directions with nearly balanced strength. The direction of magnetization of the lower layer in contact with the tunnel barrier layer is read out as information. Toggle-mode writing obviates the necessity of reversing the direction of writing current, which simplifies the driving circuits and increases the writing speed. Moreover, it is possible to form the writing wiring and the reading wiring independently from each other, which makes it possible to perform writing and reading almost independently.

Other advantages in Embodiment 3 are the same as those in Embodiment 1. That is, the TMR elements are arranged such that the relation of one TMR element with its surrounding TMR elements is the same for any TMR element. Thus, the proximity effect is the same for all the TMR elements, and this reduces variation.

Although not shown in FIG. 4, it is desirable that the region in which memory cells are arranged be surrounded by the dummy pattern of the same shape as the TMR elements 10, so that the TMR elements 10 at the outermost sides of the array can be formed under the same conditions as for the TMR elements 10 inside the array.

Embodiment 4

Figure 5:
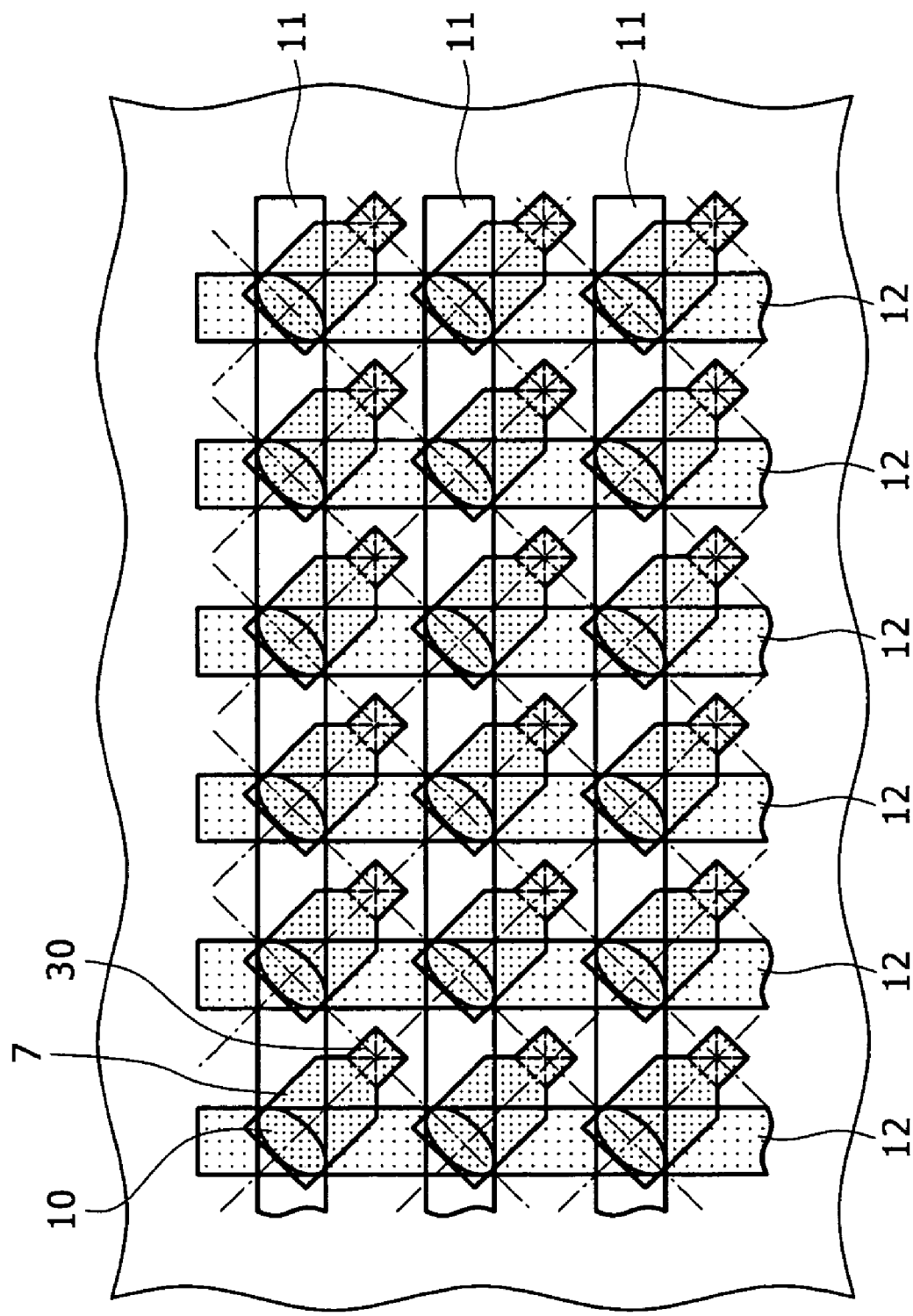
FIG. 5 is a plan view showing the arrangement of memory cells in MRAM according to the fourth embodiment of the present invention.

FIG. 5 is a plan view showing the arrangement of memory cells in the magnetic memory device (MRAM) according to the fourth embodiment. The MRAM shown in FIG. 5 is identical with the MRAM shown in FIG. 4 according to Embodiment 3 in that each memory cell is that of 1T1J type which has one TMR element 10 and one transistor for reading (selection). Each memory cell also includes the lead wiring 7 which extends from the leading electrode 6 of the TMR element 10 and the reading connecting plug 30 which connects the lead wiring 7 to the drain electrode of the transistor for reading (selection). It further includes the bit lines 11 and the writing word lines 12 which are connected to individual memory cells. As in FIG. 1, FIG. 5 does not show, for brevity, the wirings and the transistors for reading (selection) which are formed in the lower layer.

A feature in common with Embodiment 3 is that the long axis of the pattern of the TMR element 10 is oriented aslant 45° to the bit line 11 and the writing word line 12, so that the TMR elements 10 are capable of toggle-mode writing.

The MRAM shown in FIG. 5 has better symmetry in arrangement than the MRAM according to Embodiment 3 shown in FIG. 4. Chain lines (auxiliary lines) are drawn in FIG. 5 for an easy understanding of pattern symmetry. In the MRAM shown in FIG. 4, the relative position of one TMR element 10 with respect to its adjacent TMR elements 10 is the same for all the TMR elements 10 in the cell array. However, two adjacent elements are not bilaterally symmetrical about the long axis of the bit pattern. Thus, there is the possibility that the resist pattern becomes asymmetrical about the long axis. In this embodiment, all the TMR elements 10 are symmetrical about both the long axis and the short axis of the bit pattern, and hence the proximity effect is uniform for all of the element patterns and highly symmetric patterns are formed. This leads to reduction in variation among TMR elements 10 and the MRAM device with symmetrically arranged TMR elements 10 has easy-to-control characteristics.

Other advantages in Embodiment 4 are the same as those in Embodiment 1. That is, the TMR elements are arranged such that the relation of one TMR element with its surrounding TMR elements is the same for any TMR element. Thus, the proximity effect is the same for all the TMR elements, and this reduces variation.

Although not shown in FIG. 5, it is desirable that the region in which memory cells are arranged be surrounded by the dummy pattern of the same shape as the TMR elements 10, so that the TMR elements 10 at the outermost sides of the array can be formed under the same conditions as for the TMR elements 10 inside the array.

While the invention has been described with reference to preferred embodiments thereof, it will be understood that the embodiments are illustrative and not restrictive and other changes can be made therein without departing from the sprit and scope of the invention.

What is claimed is:

1. A solid-state memory device having information storing parts arranged two-dimensionally, wherein said arrangement conforms to a pattern of translational symmetry, which is a magnetic memory device in the form of an array of magnetic memory elements as the information storing parts, each being a laminate structure composed of a magnetization pinned layer whose direction of magnetization is fixed, a tunnel barrier layer, and a magnetization free layer whose direction of magnetization is variable.

2. The solid-state memory device as defined in claim 1, wherein the laminate structures are arranged in a pattern having an axis of line symmetry such that adjacent laminate structures are symmetrical about the axis of line symmetry.

3. The solid-state memory device as defined in claim 1, wherein the arrangement is made such that one of adjacent laminate structures is shifted half a pitch from the other of adjacent laminate structures in a first direction.

4. The solid-state memory device as defined in claim 1, wherein the laminate structures are arranged such that the region of their array is surrounded by a dummy pattern of the same shape as the laminate structures.

5. The solid-state memory device as defined in claim 1, wherein the information storing parts are arranged in a plane pattern having an axis of line symmetry so that adjacent information storing parts are symmetrical about the axis of line symmetry.

6. The solid-state memory device as defined in claim 1, wherein said laminate structure is driven by a first wiring electrically connected thereto and a second wiring electrically isolated therefrom.

7. The solid-state memory device as defined in claim 6, wherein the arrangement is made such that the first wiring and the second wiring intersect orthogonally with each other and that the pattern of the laminate structures has an axis of line symmetry, which intersects with the first or second wiring at an angle of 0°, 90°, 180°, or 270°.

8. The solid-state memory device as defined in claim 7, wherein connecting holes to connect the leading wiring of the laminate structures to the lower wiring are arranged in a pattern having an axis of line symmetry and adjacent connecting holes are symmetrical about the axis of line symmetry.

9. A solid-state memory device as defined in claim 6, which is constructed such that the tunnel barrier layer is interposed between the magnetization pinned layer and the magnetization free layer, the magnetization free layer is magnetized for information writing by a magnetic field induced by current flowing through the first wiring as the bit line and the second wiring as the writing word line, and written information is read out by utilizing the tunnel magnetoresistance effect due to the tunnel barrier layer.

10. A method for two-dimensional arrangement of information storing parts in a solid-state memory device, wherein said arrangement is in a pattern of translational symmetry, wherein the solid-state memory device is composed of magnetic elements as the information storing parts, each being a laminate structure composed of a magnetization pinned layer whose direction of magnetization is fixed, a tunnel barrier layer, and a magnetization free layer whose direction of magnetization is variable, said laminate structure being driven by a first wiring electrically connected thereto and a second wiring electrically isolated therefrom.

* * * * *